US012191628B2

(12) United States Patent
Takiguchi et al.

(10) Patent No.: US 12,191,628 B2
(45) Date of Patent: Jan. 7, 2025

(54) SEMICONDUCTOR LIGHT EMITTING DEVICE

(71) Applicant: Sony Group Corporation, Tokyo (JP)

(72) Inventors: Yoshiro Takiguchi, Tokyo (JP);
Hisayoshi Motobayashi, Tokyo (JP);
Hiroyuki Miyahara, Kumamoto (JP);
Masahiro Murayama, Tokyo (JP);
Hidekazu Kawanishi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 793 days.

(21) Appl. No.: 17/422,351

(22) PCT Filed: Dec. 6, 2019

(86) PCT No.: PCT/JP2019/047883
§ 371 (c)(1),
(2) Date: Jul. 12, 2021

(87) PCT Pub. No.: WO2020/162023
PCT Pub. Date: Aug. 13, 2020

(65) Prior Publication Data
US 2022/0077649 A1 Mar. 10, 2022

(30) Foreign Application Priority Data
Feb. 4, 2019 (JP) .................. 2019-018059

(51) Int. Cl.
*H01S 5/0239* (2021.01)
*H01S 5/02208* (2021.01)
(Continued)

(52) U.S. Cl.
CPC ........ *H01S 5/0239* (2021.01); *H01S 5/02208* (2013.01); *H01S 5/02253* (2021.01);
(Continued)

(58) Field of Classification Search
CPC .............. H01S 5/0239; H01S 5/02208; H01S 5/02253; H01S 5/02255; H01S 5/023; H01S 5/02345; H01S 5/32341; H01S 5/4093
See application file for complete search history.

(56) References Cited

U.S. PATENT DOCUMENTS

2014/0226689 A1 8/2014 Takeda
2017/0314768 A1 11/2017 Kiyota
(Continued)

FOREIGN PATENT DOCUMENTS

CN 103000790 A 3/2013
JP H05-129711 A 5/1993
(Continued)

OTHER PUBLICATIONS

International Search Report issued in International Patent Application No. PCT/JP2019/047883 on Mar. 3, 2020 and English translation of same. 5 pages.

(Continued)

*Primary Examiner* — Yuanda Zhang
(74) *Attorney, Agent, or Firm* — K&L Gates LLP

(57) ABSTRACT

There is provided a semiconductor light emitting device that allows the internal resistance to be improved. A semiconductor light emitting device according to an embodiment of the present disclosure includes: a light emitting element; a first housing member and a second housing member at least one of which has a wiring structure; and an electrically conductive bonding section. The first housing member and the second housing member house the light emitting element. The wiring structure electrically couples the light emitting element and an outside. The electrically conductive bonding section bonds the first housing member and the (Continued)

second housing member. The electrically conductive bonding section is electrically coupled to the wiring structure.

16 Claims, 29 Drawing Sheets

(51) Int. Cl.
  *H01S 5/02253*  (2021.01)
  *H01S 5/02255*  (2021.01)
  *H01S 5/023*  (2021.01)
  *H01S 5/02345*  (2021.01)
  *H01S 5/323*  (2006.01)
  *H01S 5/40*  (2006.01)

(52) U.S. Cl.
  CPC .......... *H01S 5/02255* (2021.01); *H01S 5/023* (2021.01); *H01S 5/02345* (2021.01); *H01S 5/32341* (2013.01); *H01S 5/4093* (2013.01)

(56) References Cited

U.S. PATENT DOCUMENTS

2020/0303594 A1\* 9/2020 Sorg ...................... H01S 5/0237
2021/0376562 A1\* 12/2021 Sorg .................... H01S 5/02257

FOREIGN PATENT DOCUMENTS

| JP | 07-086693 A | 3/1995 |
| JP | 2008-015434 A | 1/2008 |
| JP | 2008072013 A | 3/2008 |
| JP | 2008-091496 A | 4/2008 |
| JP | 2013-084810 A | 5/2013 |
| JP | 2018-101692 A | 6/2018 |

OTHER PUBLICATIONS

Written Opinion issued in International Patent Application No. PCT/JP2019/047883 on Mar. 3, 2020. 3 pages.

\* cited by examiner

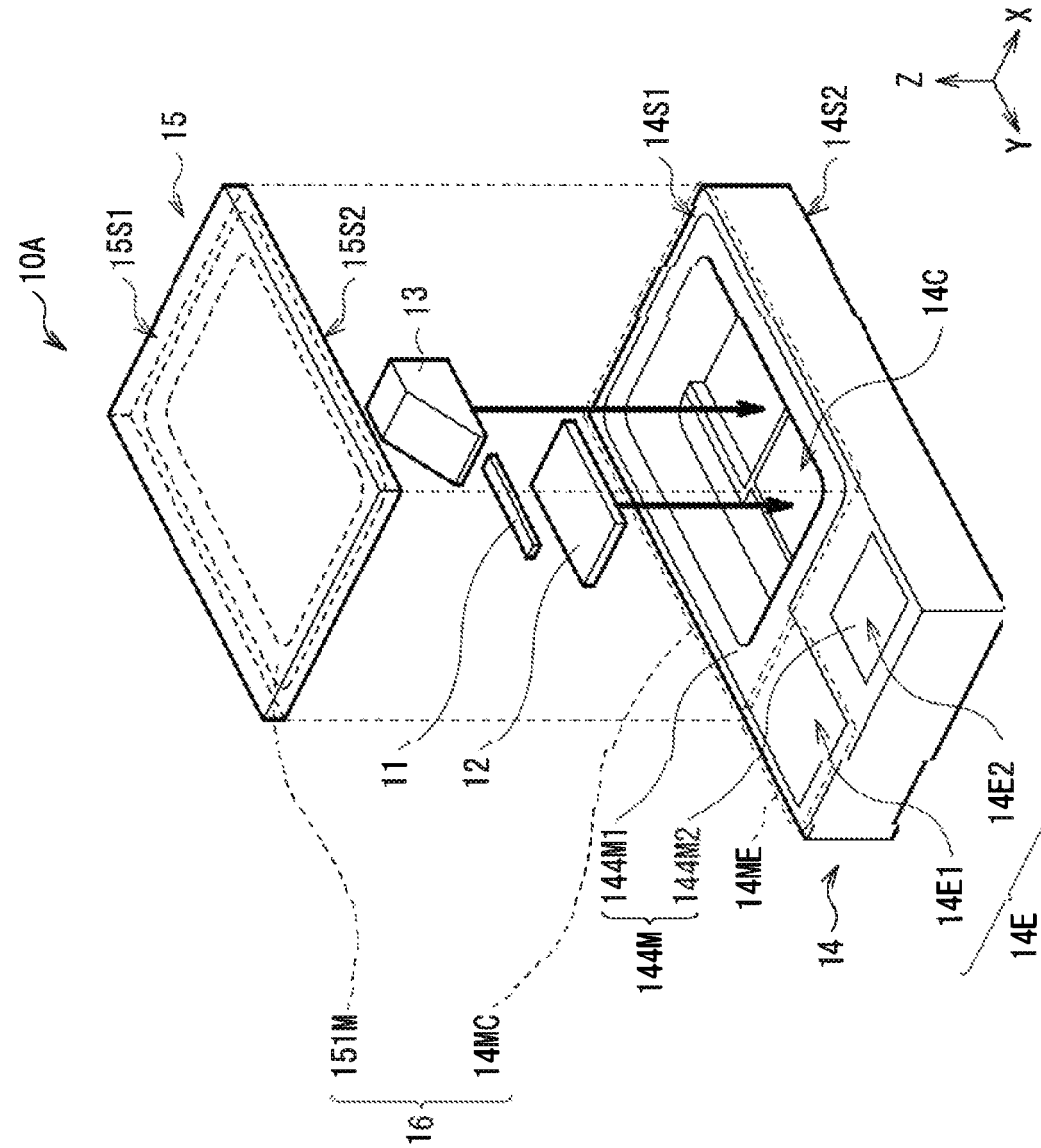

[ FIG. 2 ]
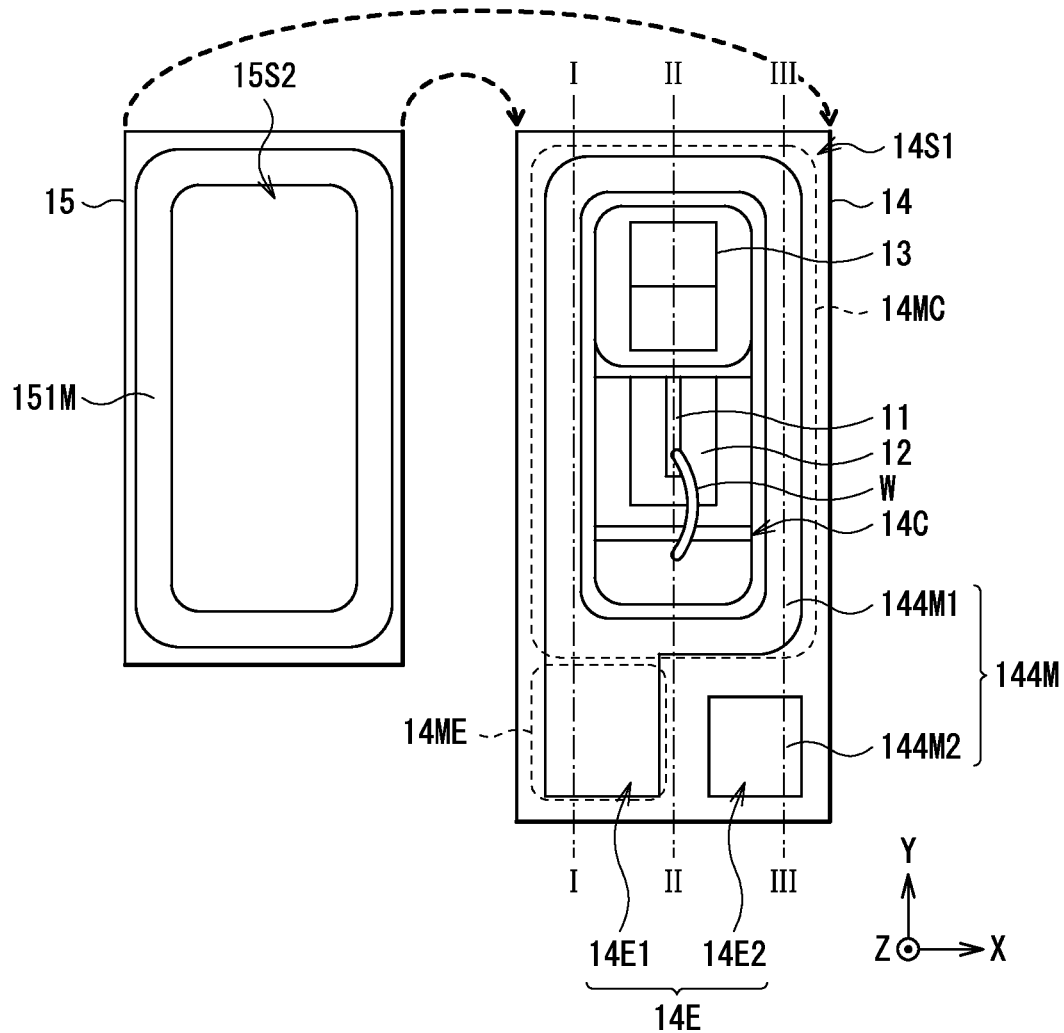

[ FIG. 3 ]
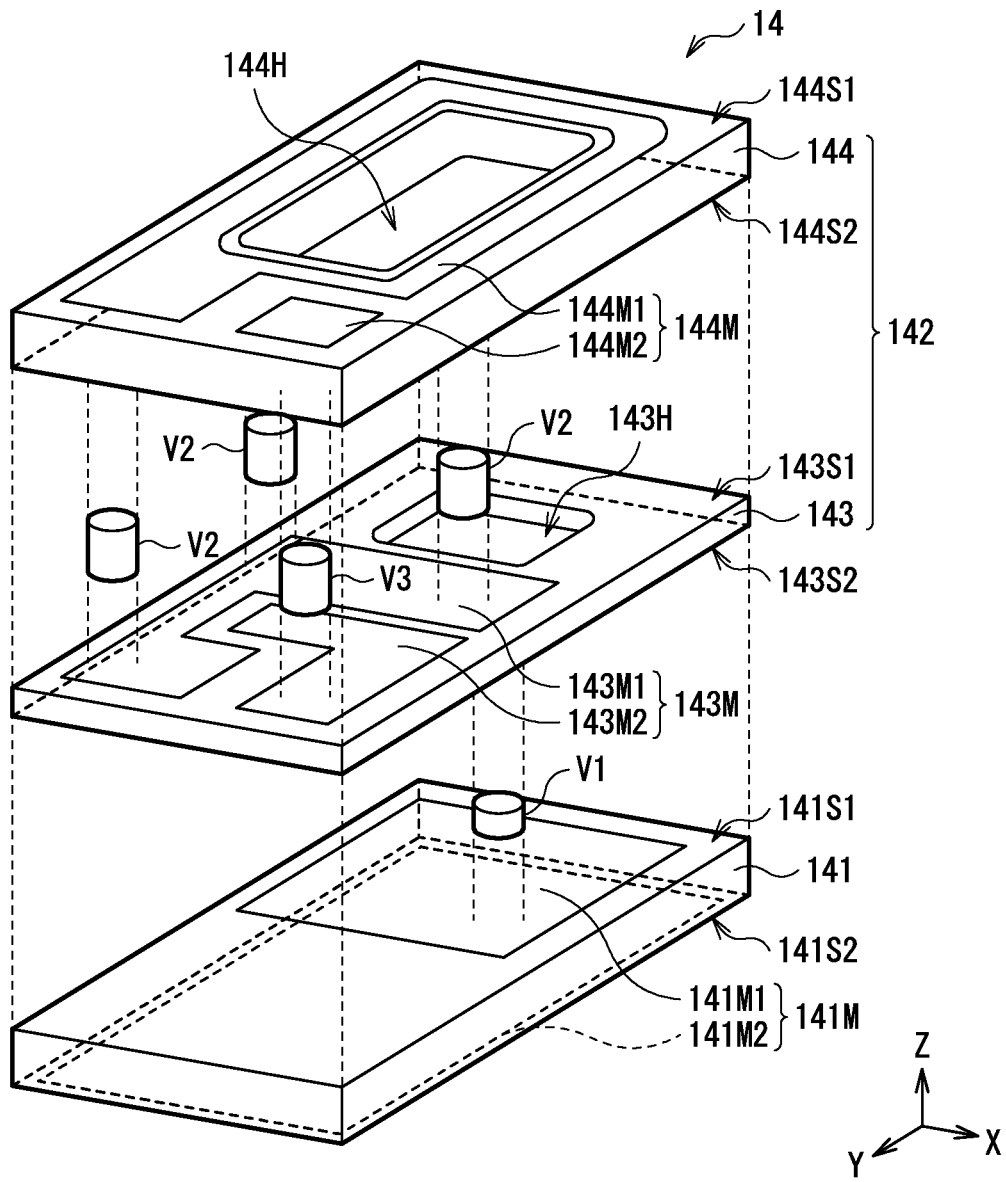

[ FIG. 4A ]
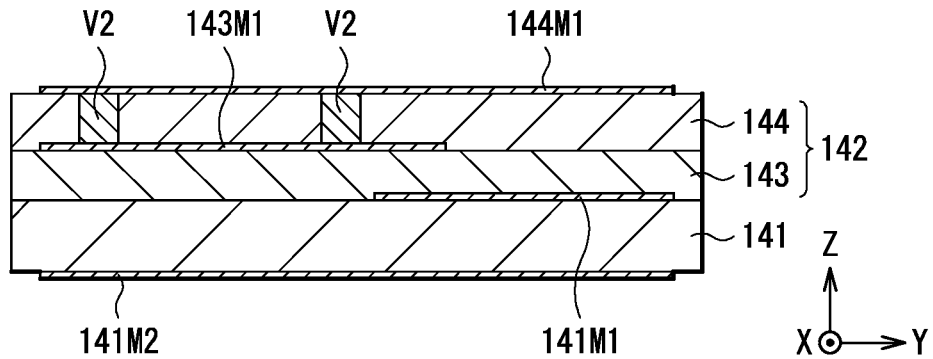
[ FIG. 4B ]
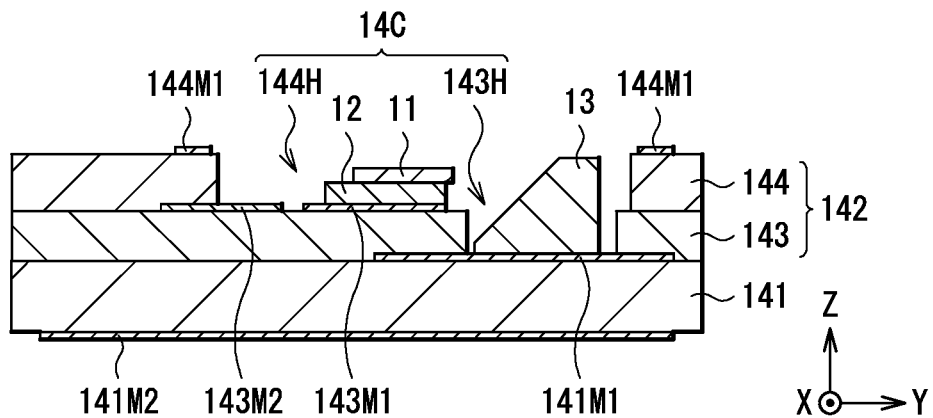
[ FIG. 4C ]
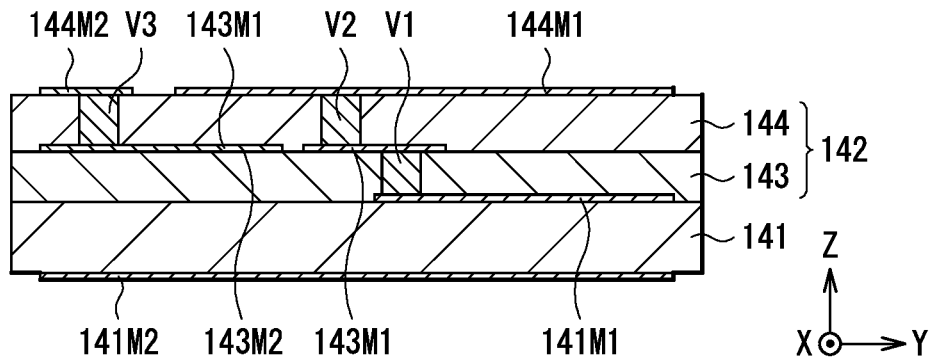

[ FIG. 5 ]
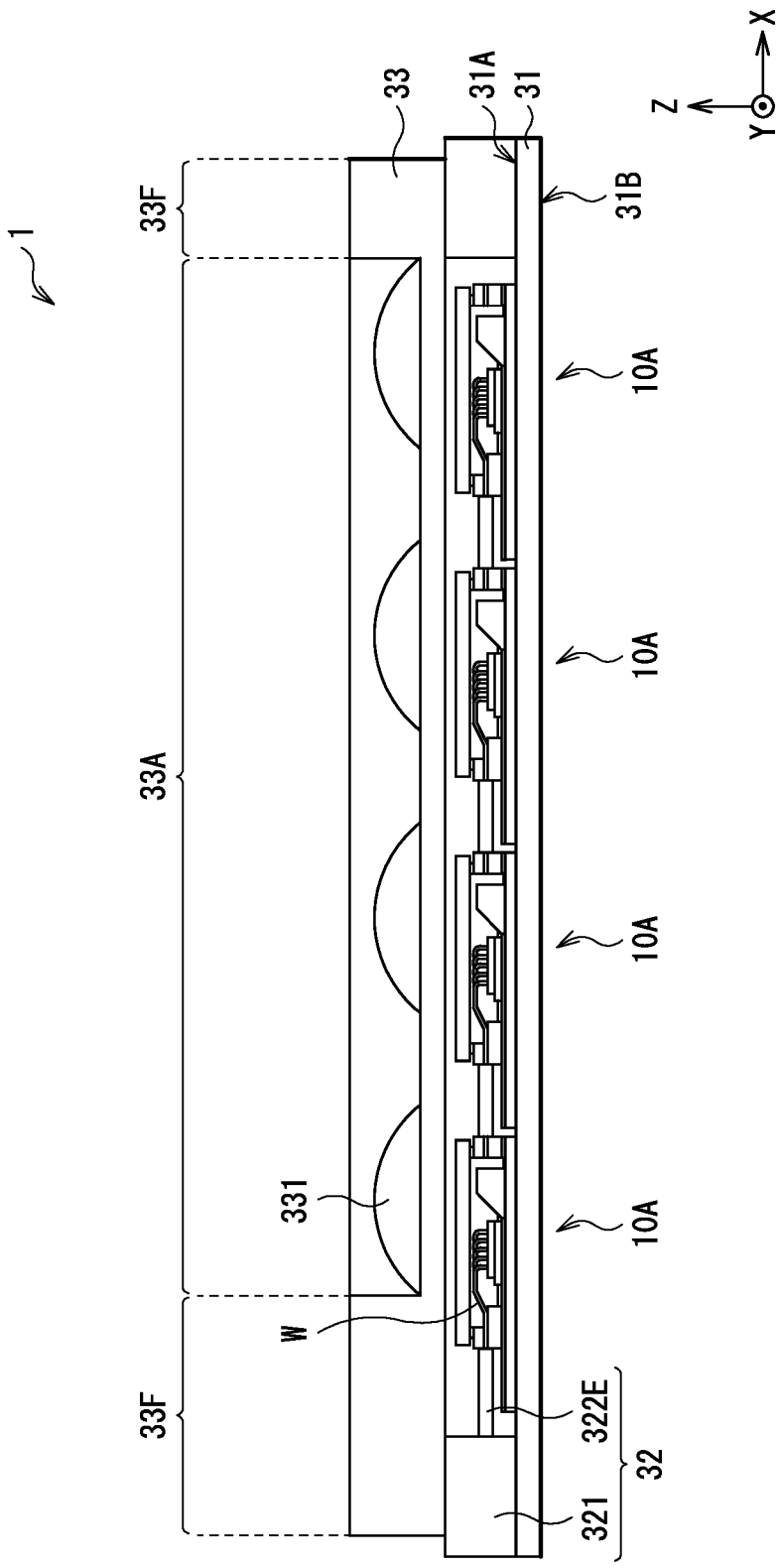

[ FIG. 6 ]
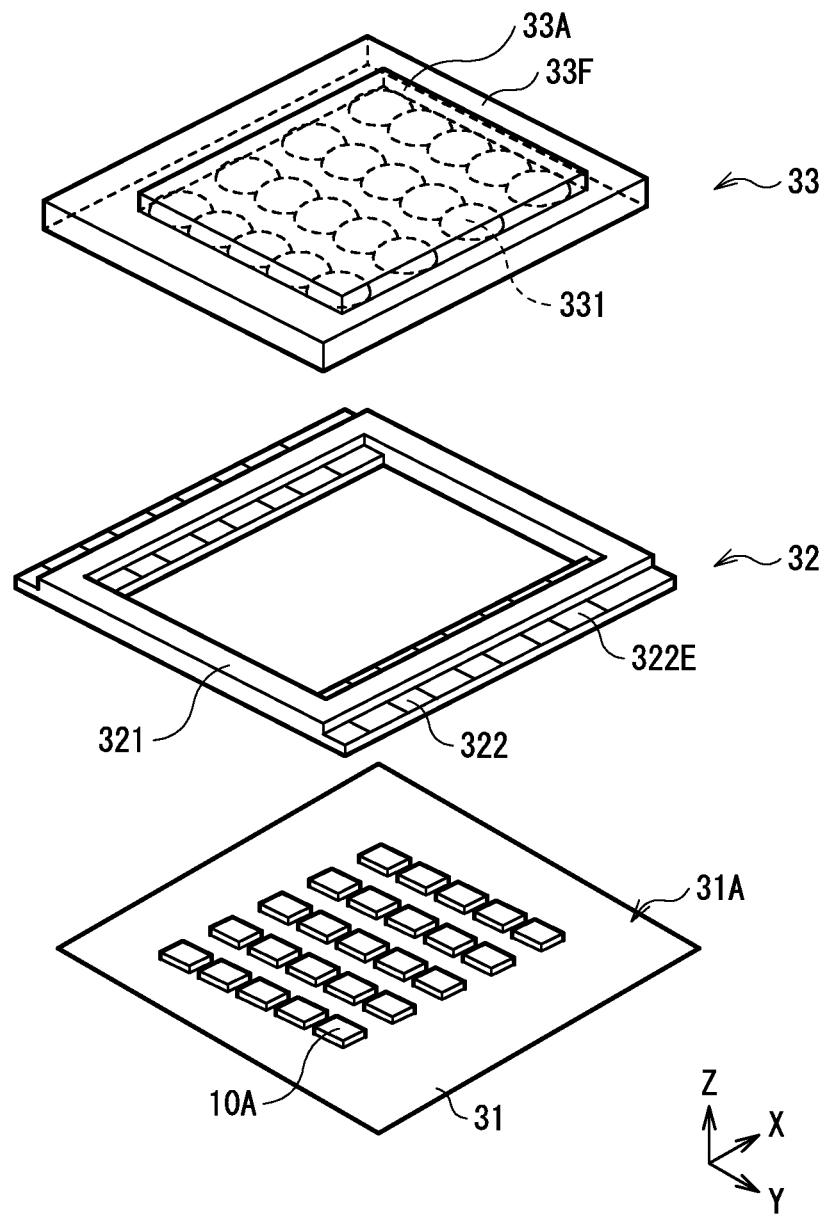

[ FIG. 7 ]
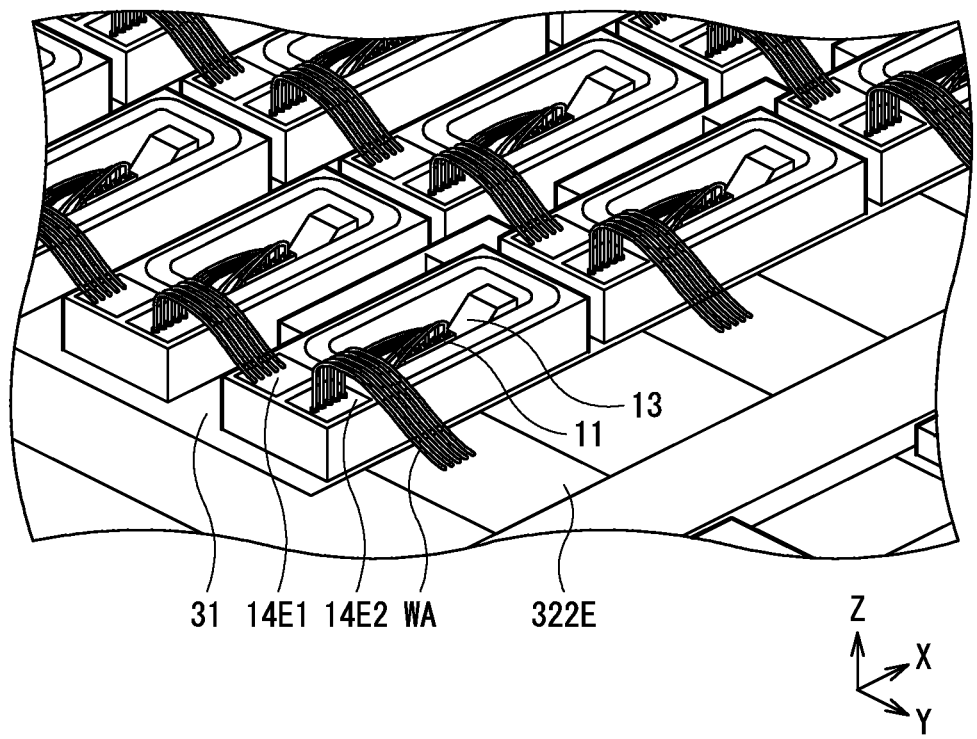

[ FIG. 8 ]
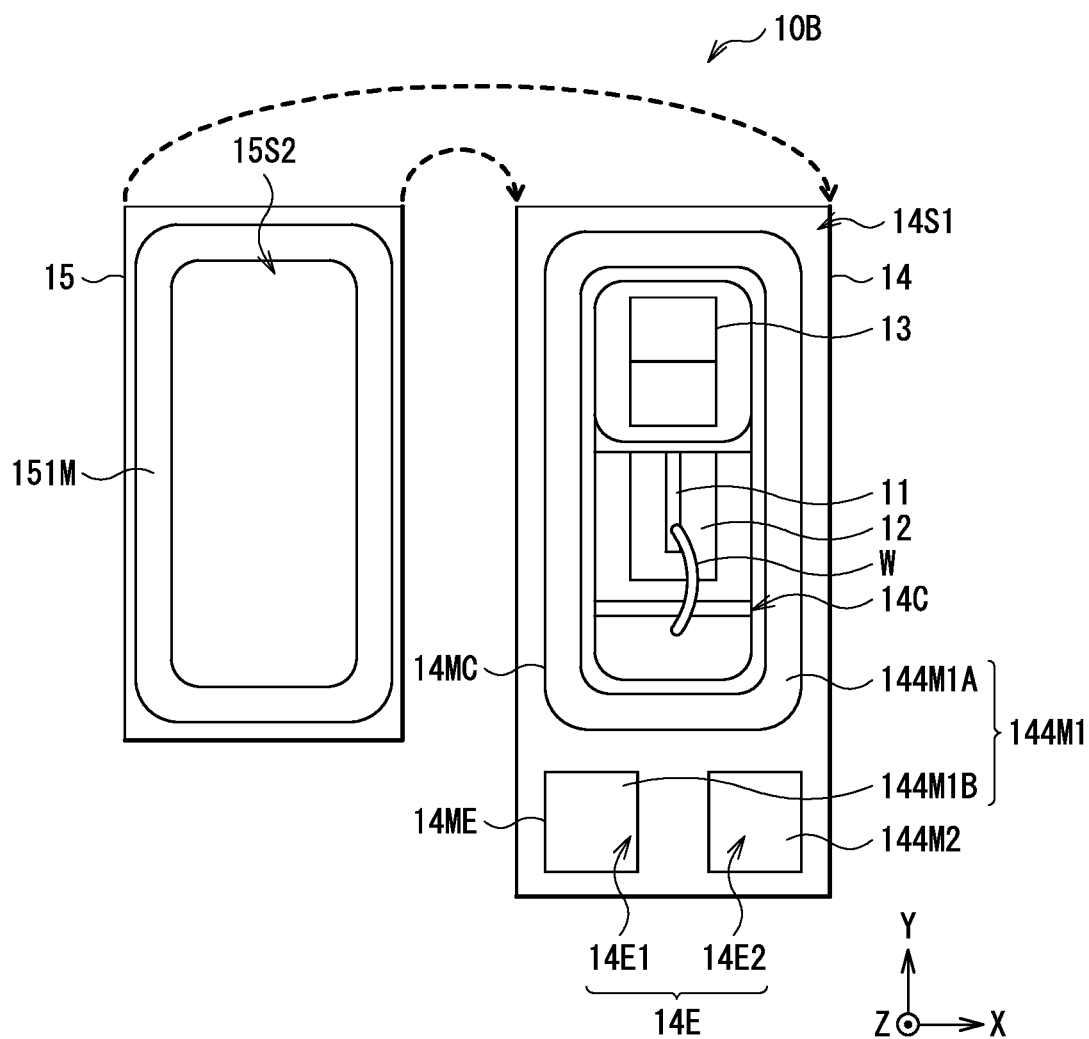

[ FIG. 9 ]
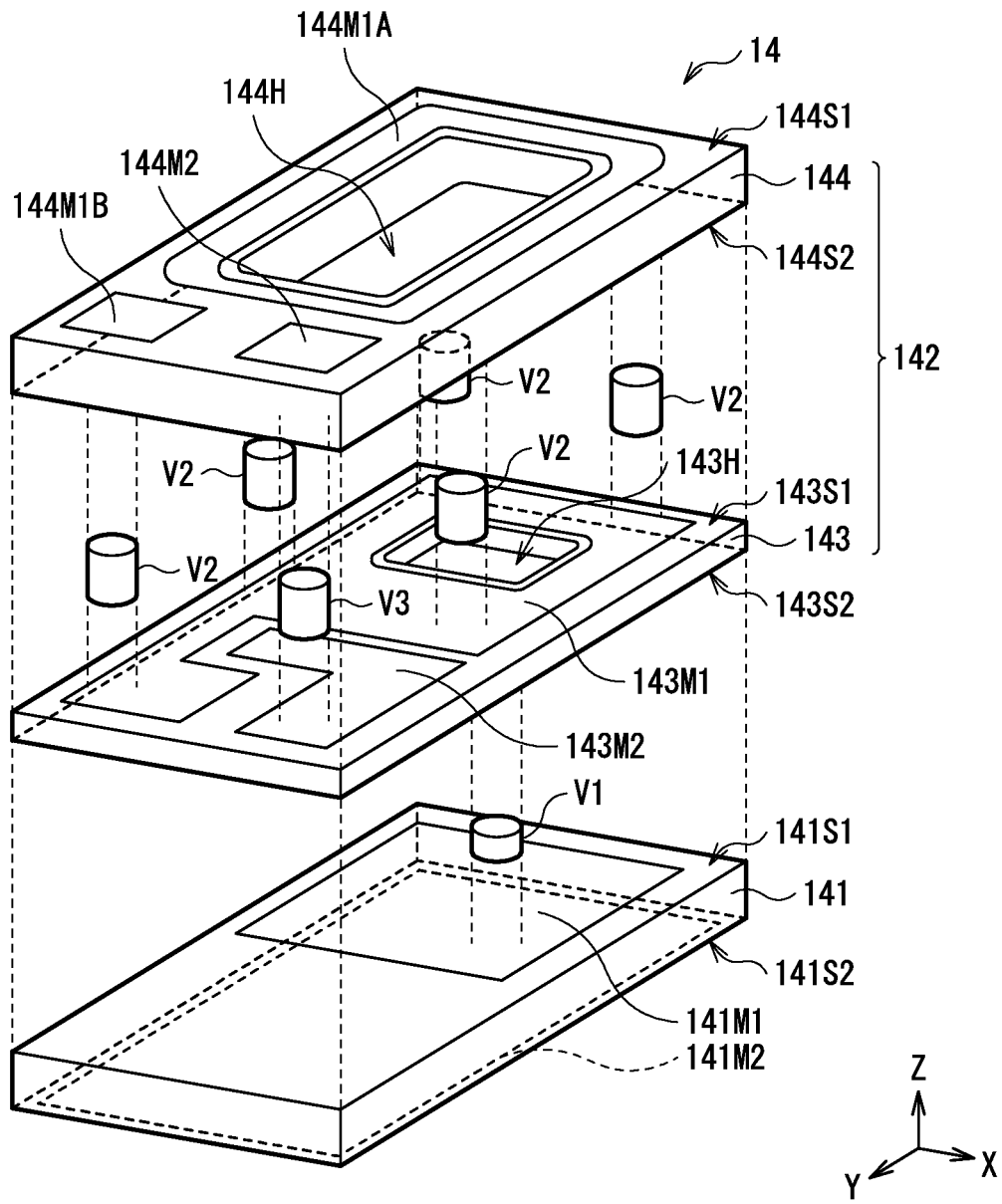

[ FIG. 10 ]
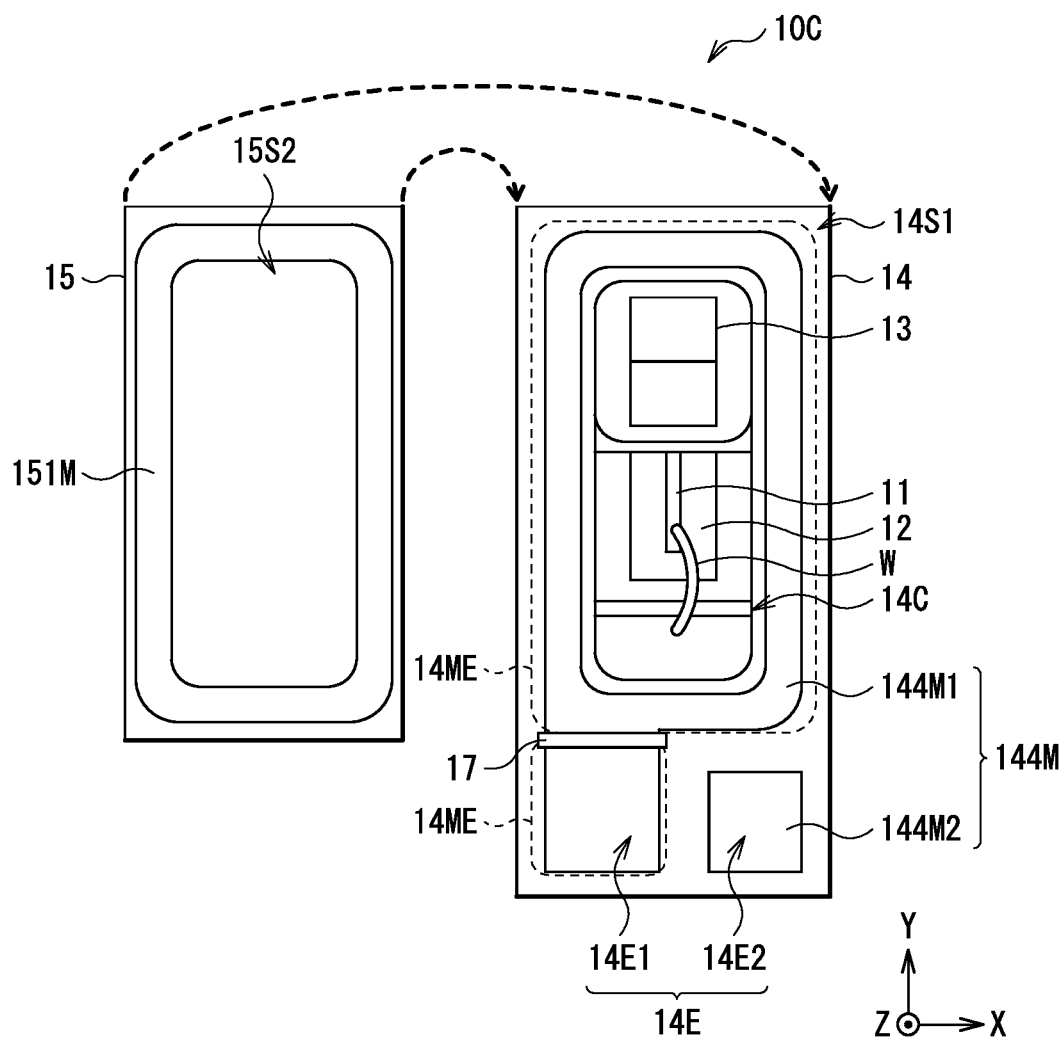

[ FIG. 11 ]
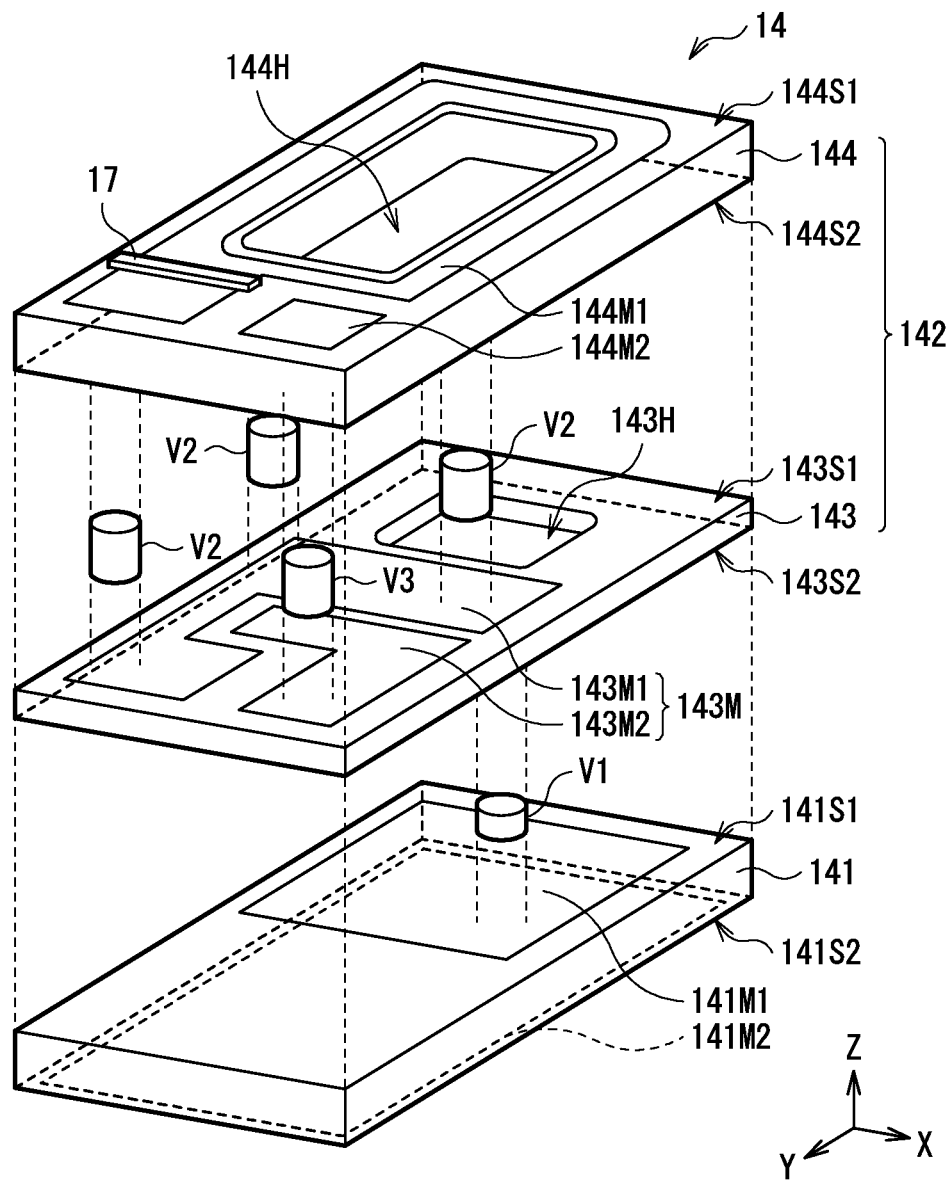

[ FIG. 12A ]
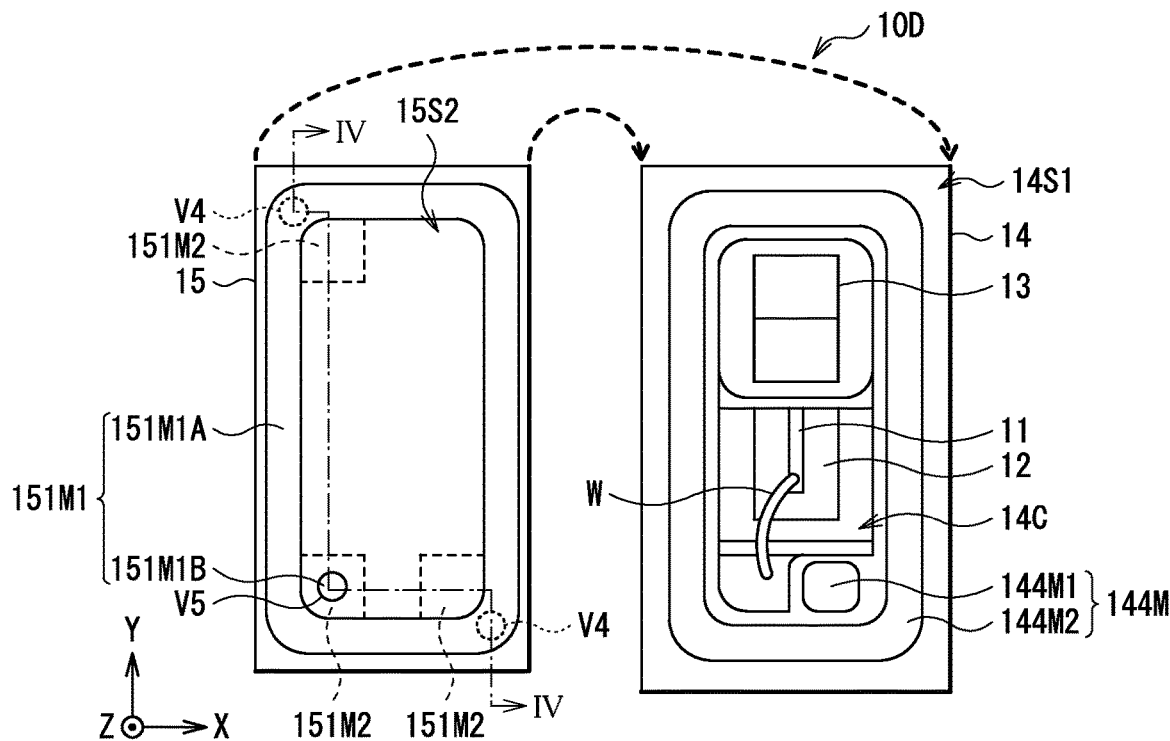
[ FIG. 12B ]
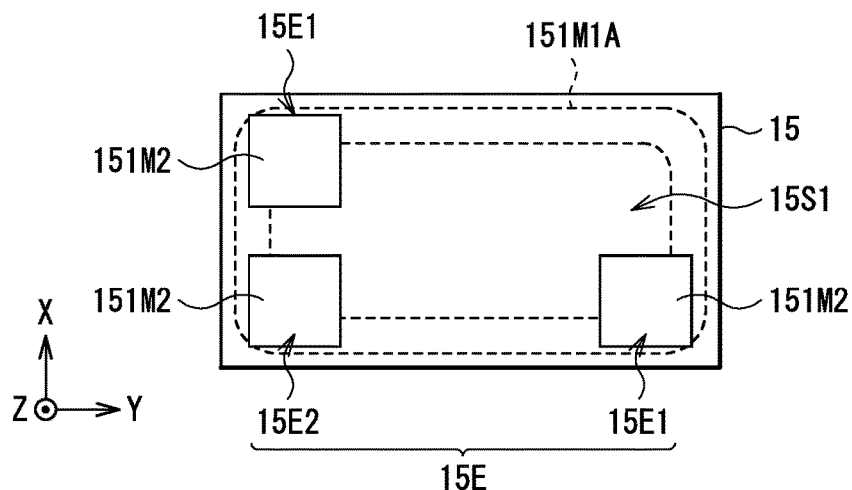
[ FIG. 12C ]
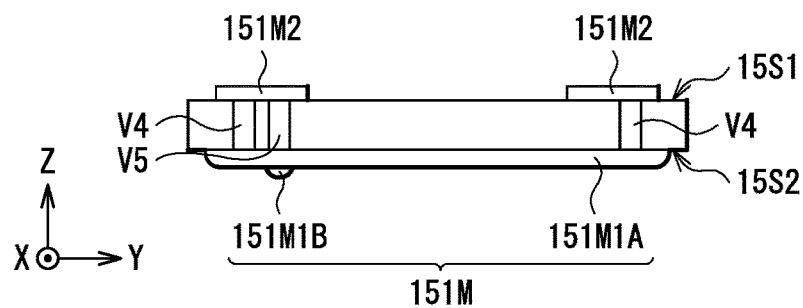

[ FIG. 13 ]
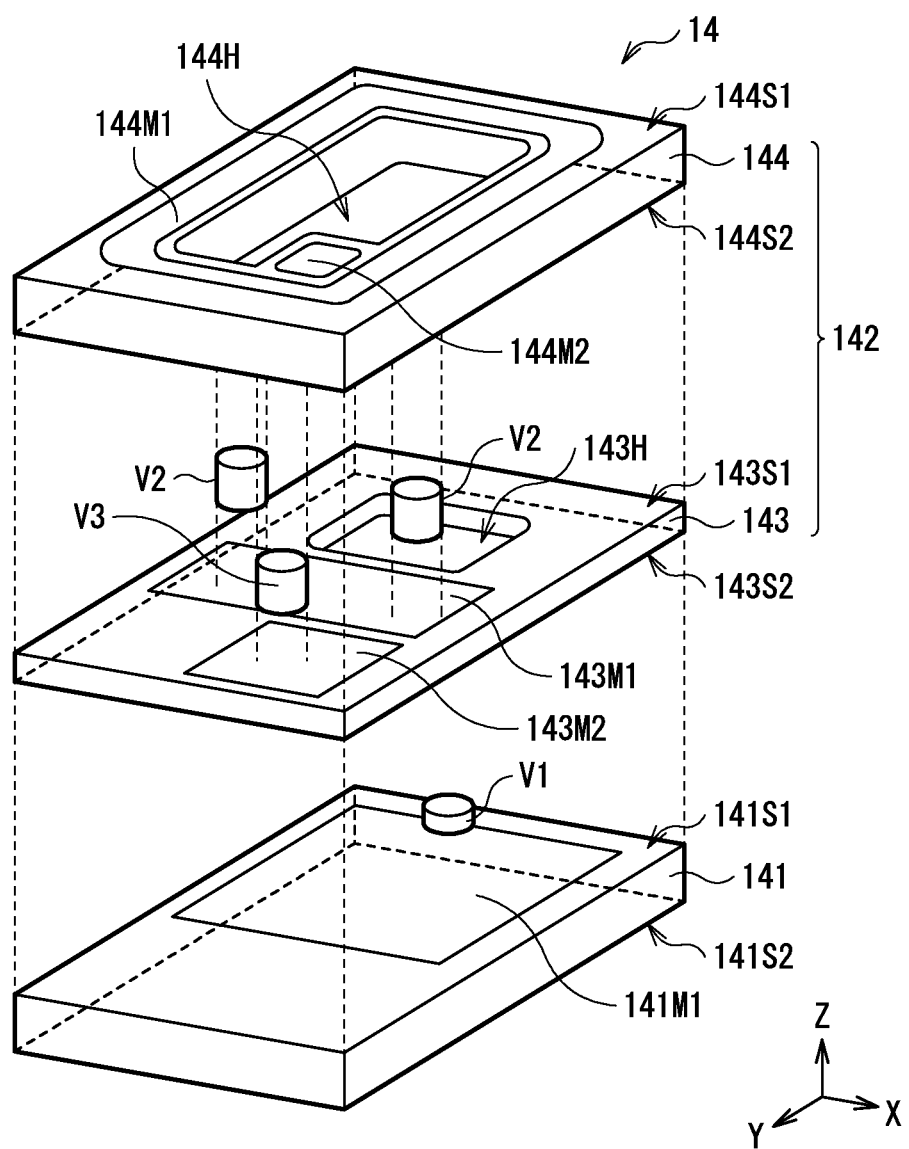

[ FIG. 14A ]
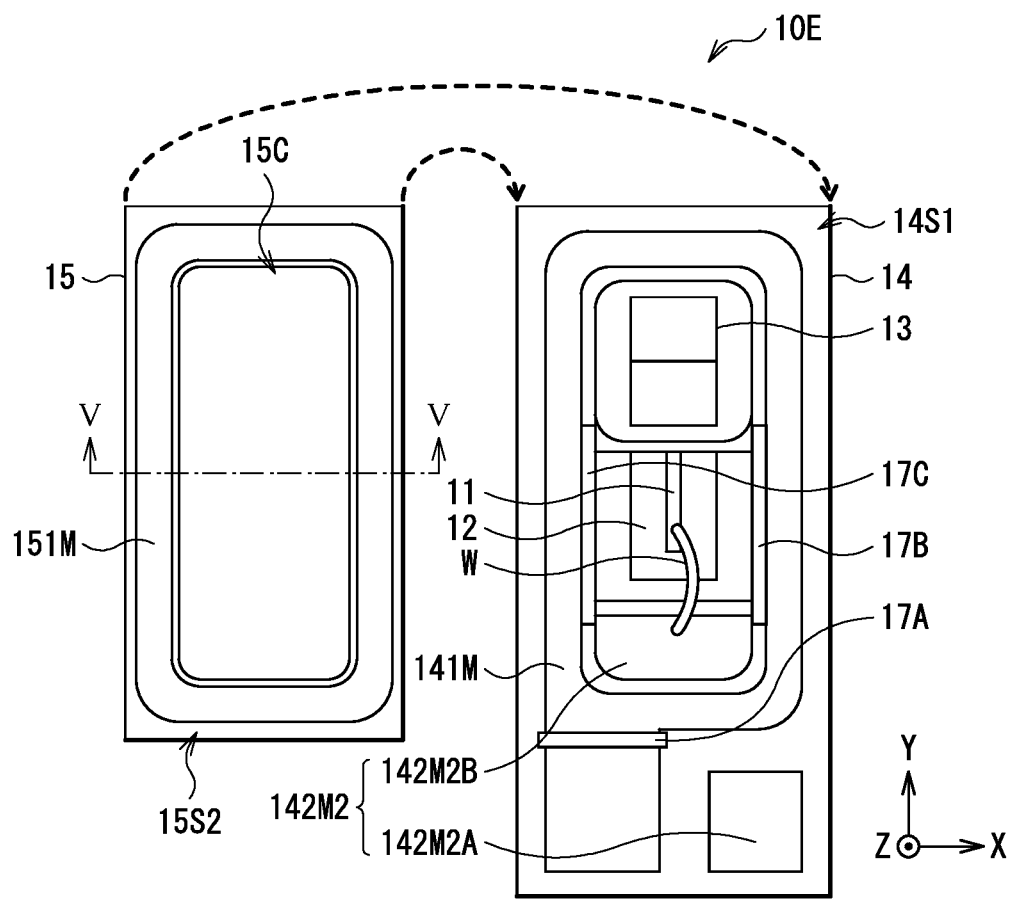
[ FIG. 14B ]
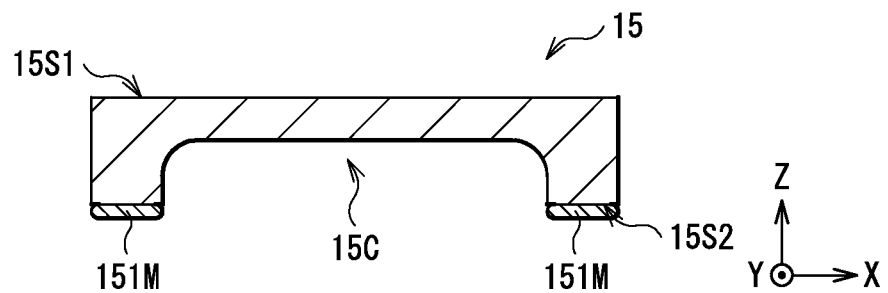

[ FIG. 15 ]
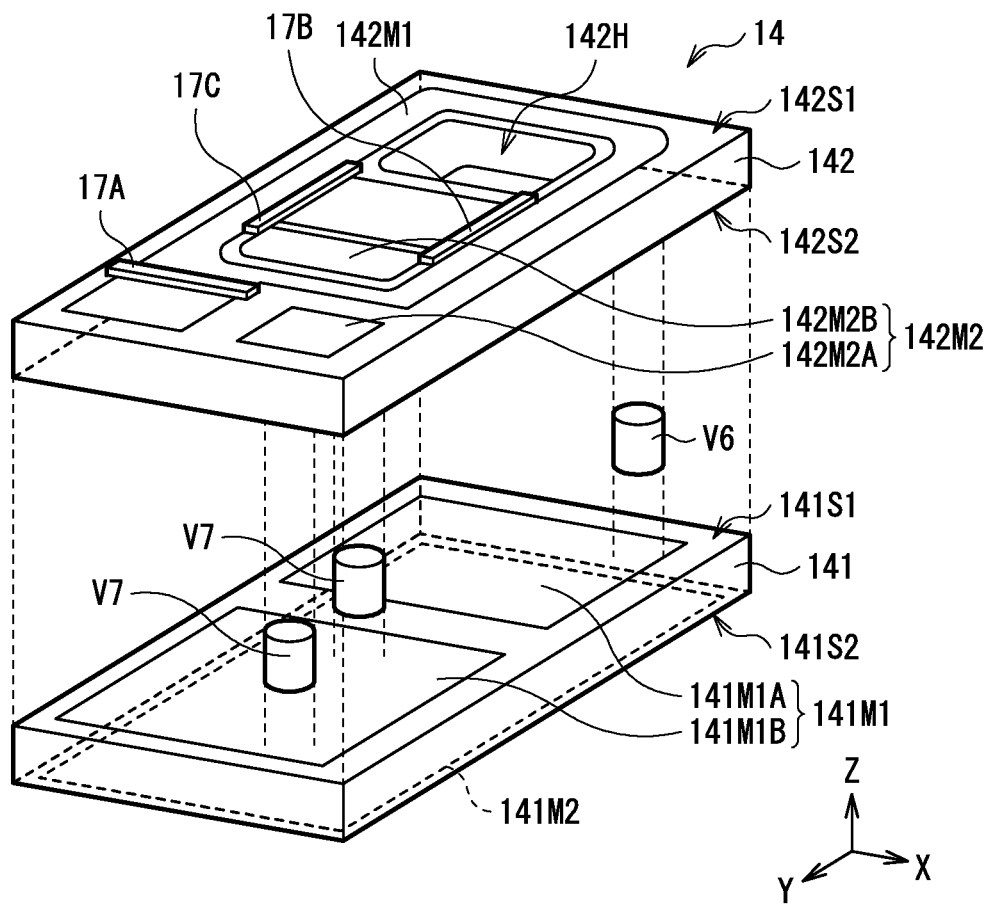

[ FIG. 16 ]
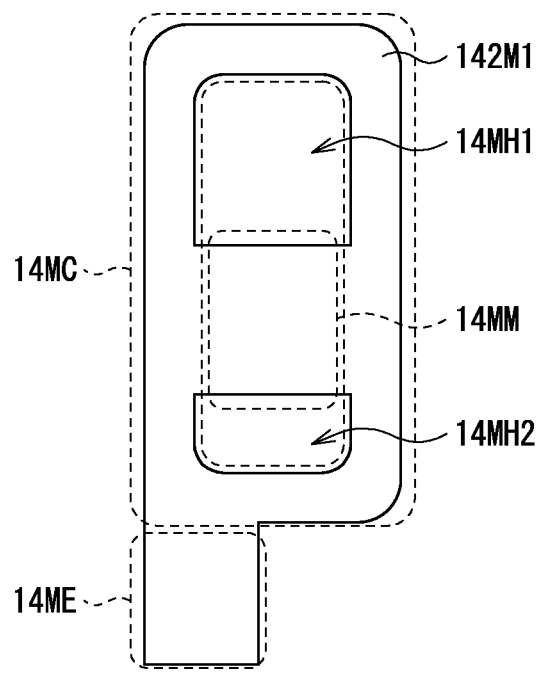
[ FIG. 17 ]
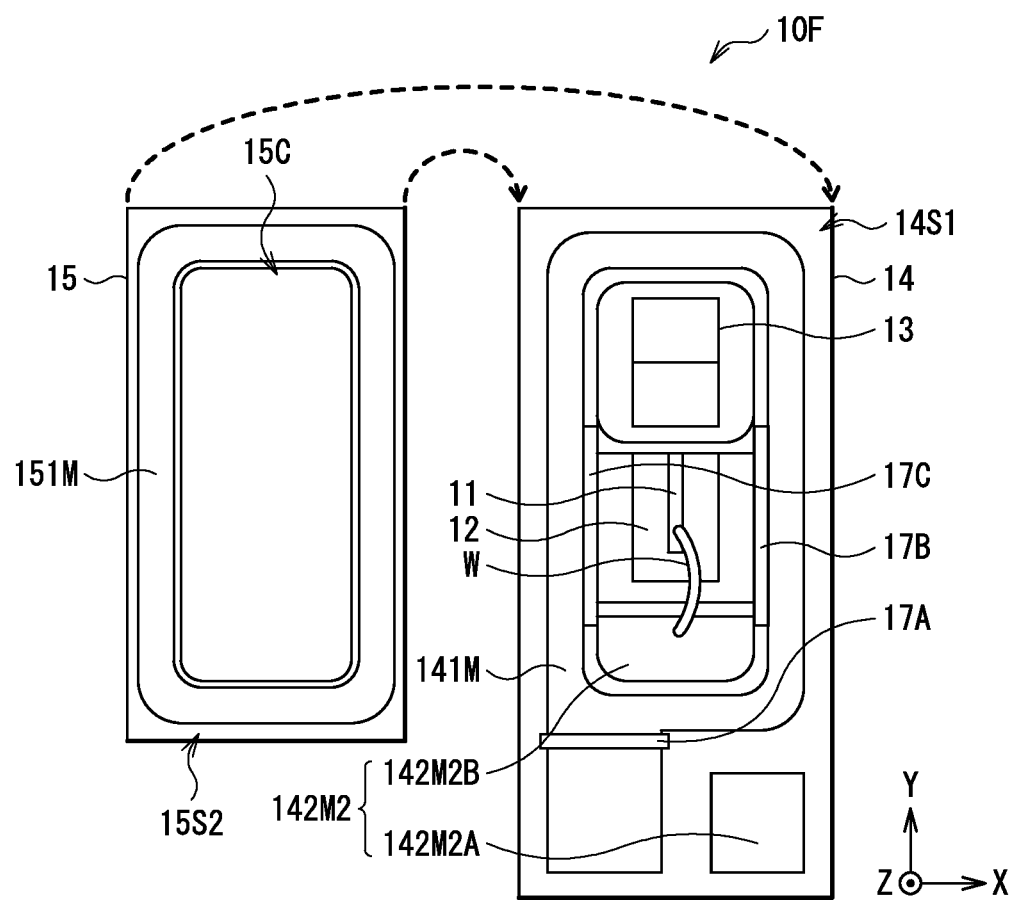

[ FIG. 18 ]
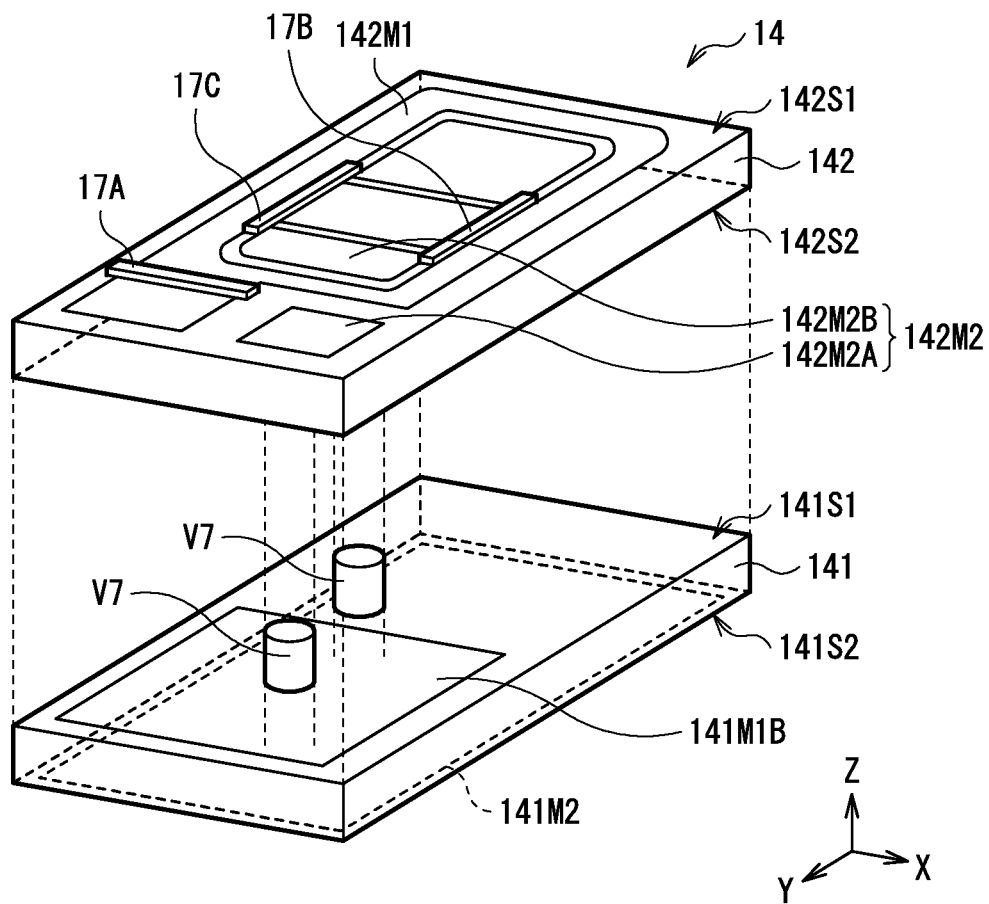

[ FIG. 19 ]
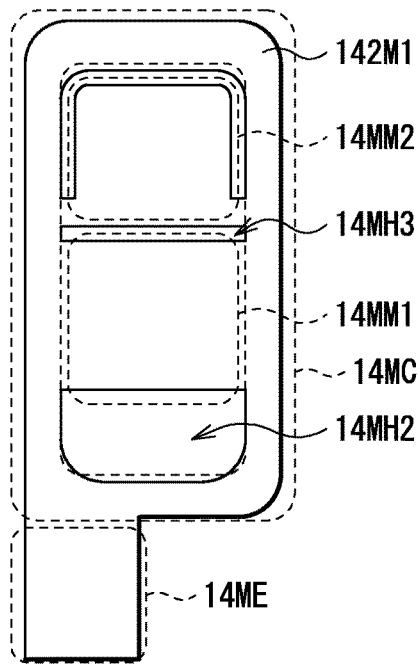
[ FIG. 20 ]
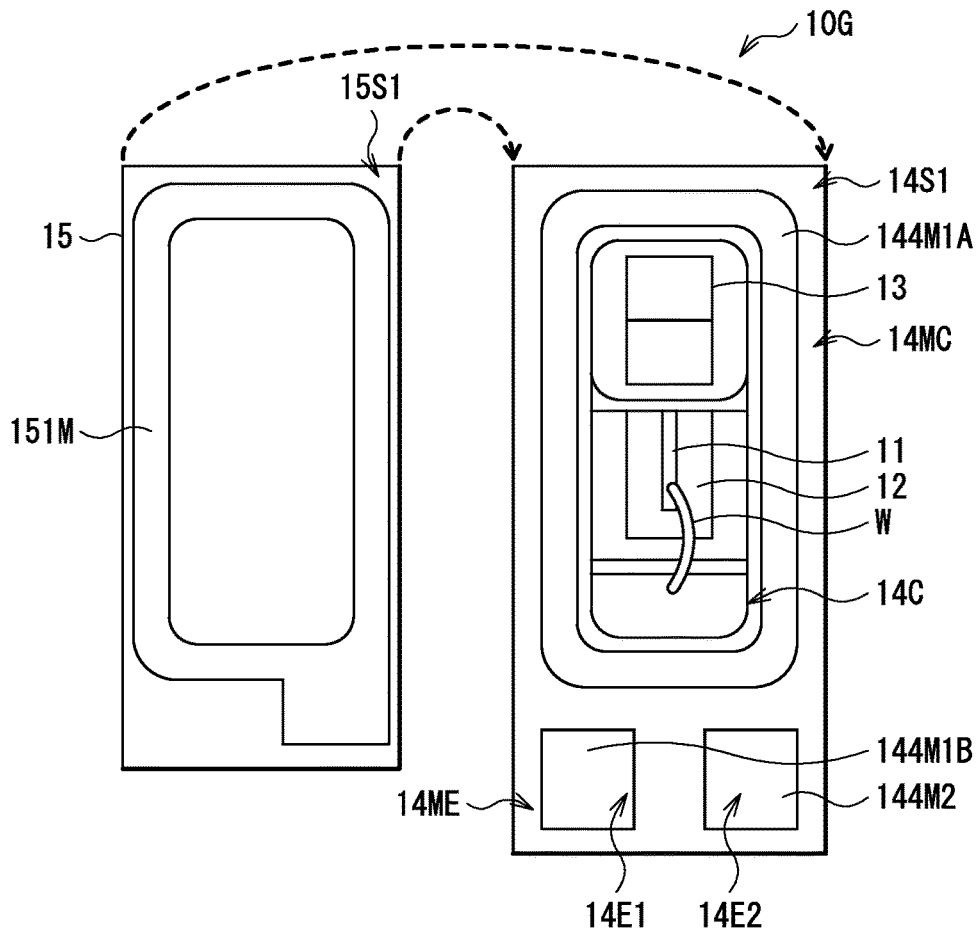

[ FIG. 21 ]
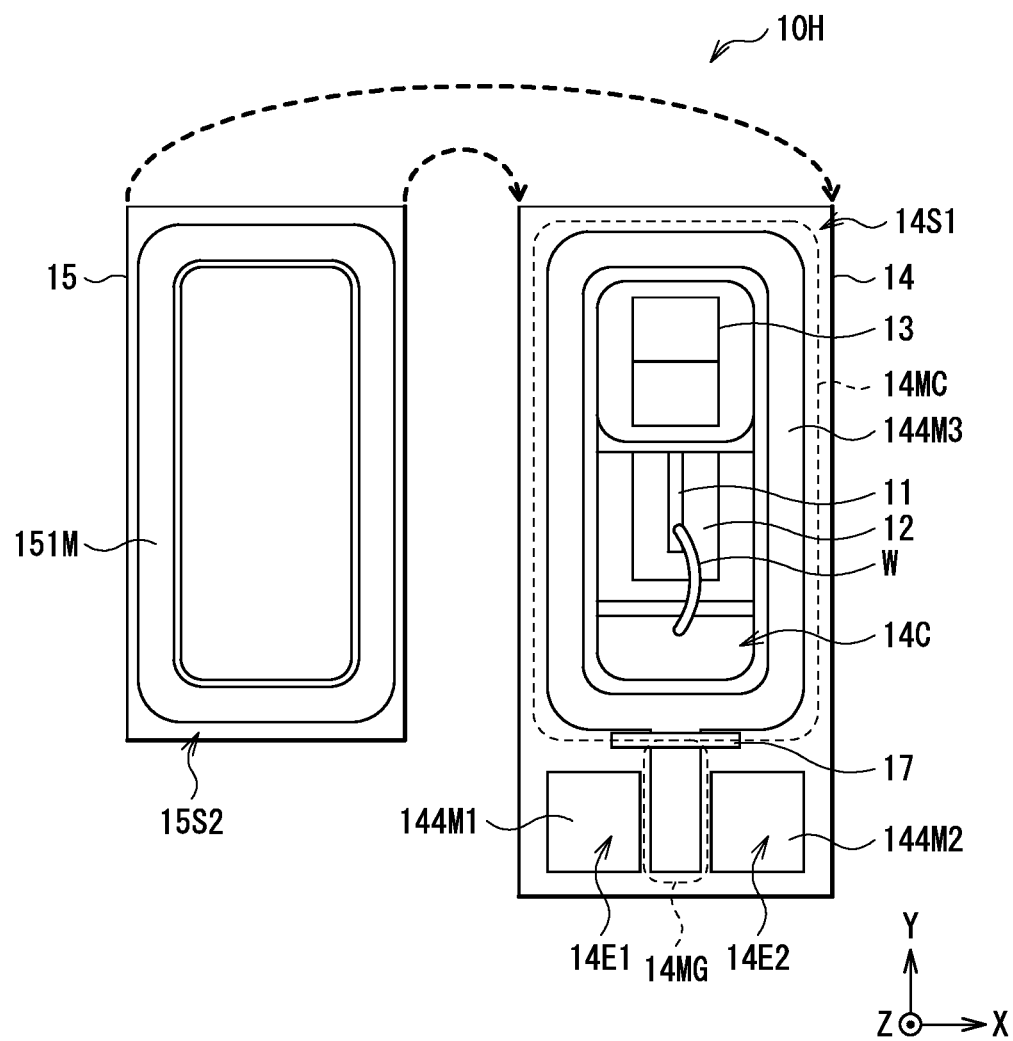

[ FIG. 22 ]
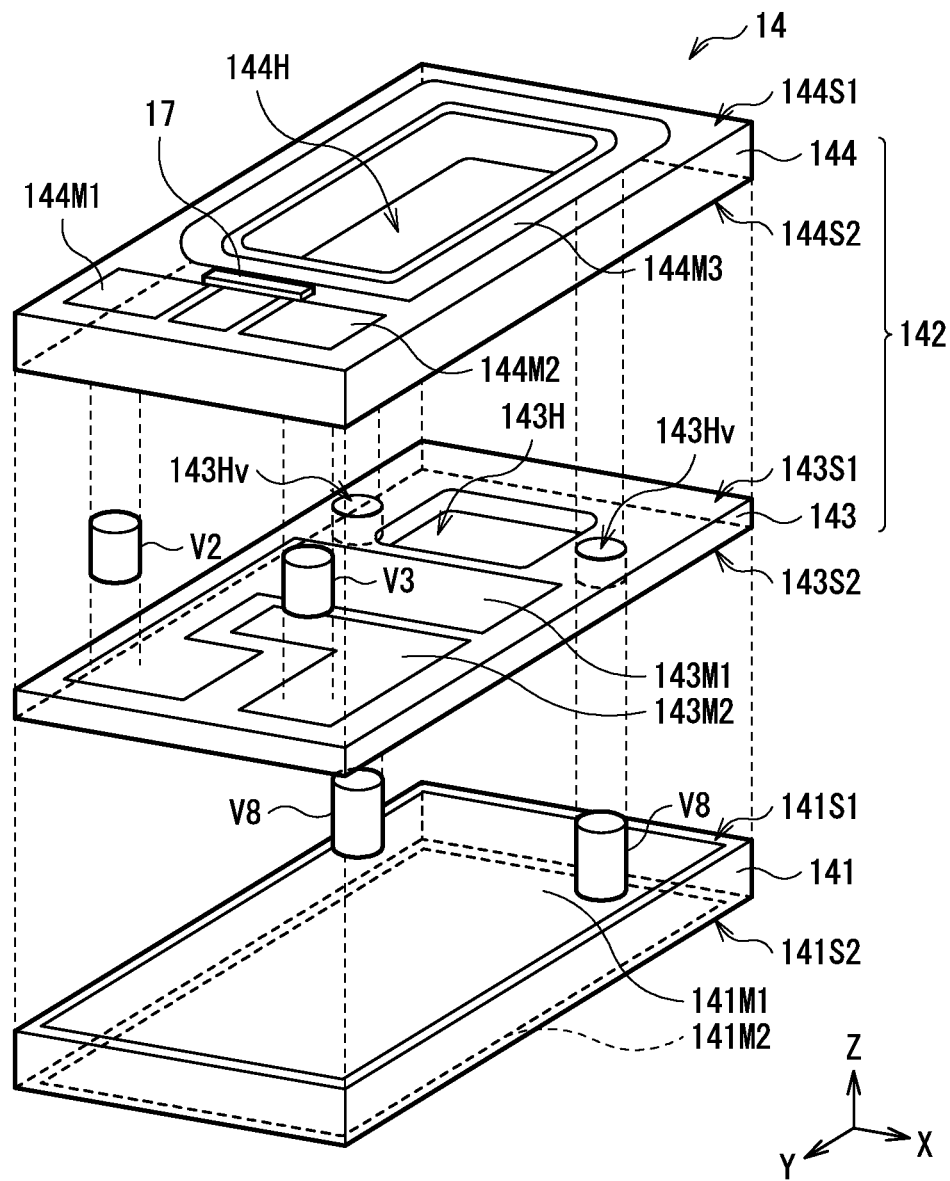

[ FIG. 23 ]
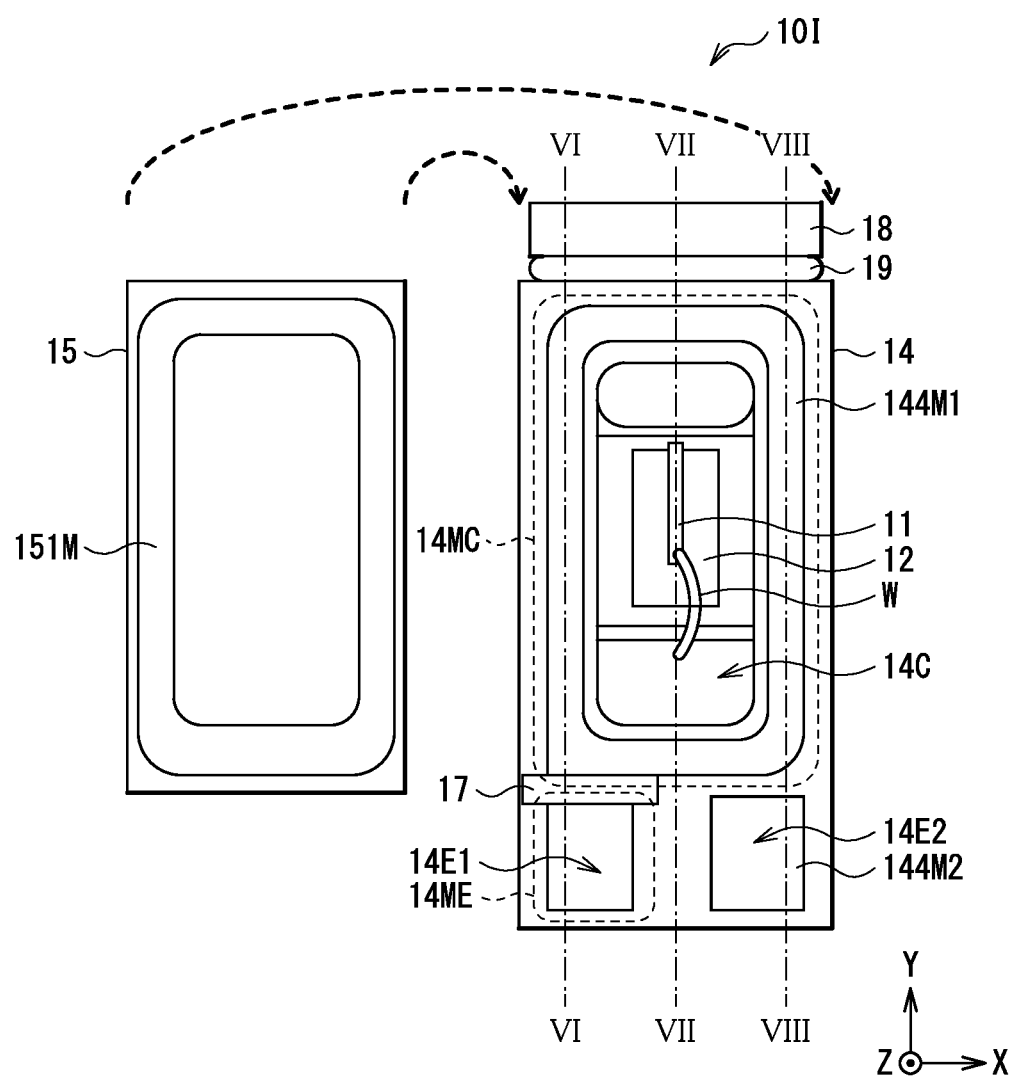

[ FIG. 24 ]
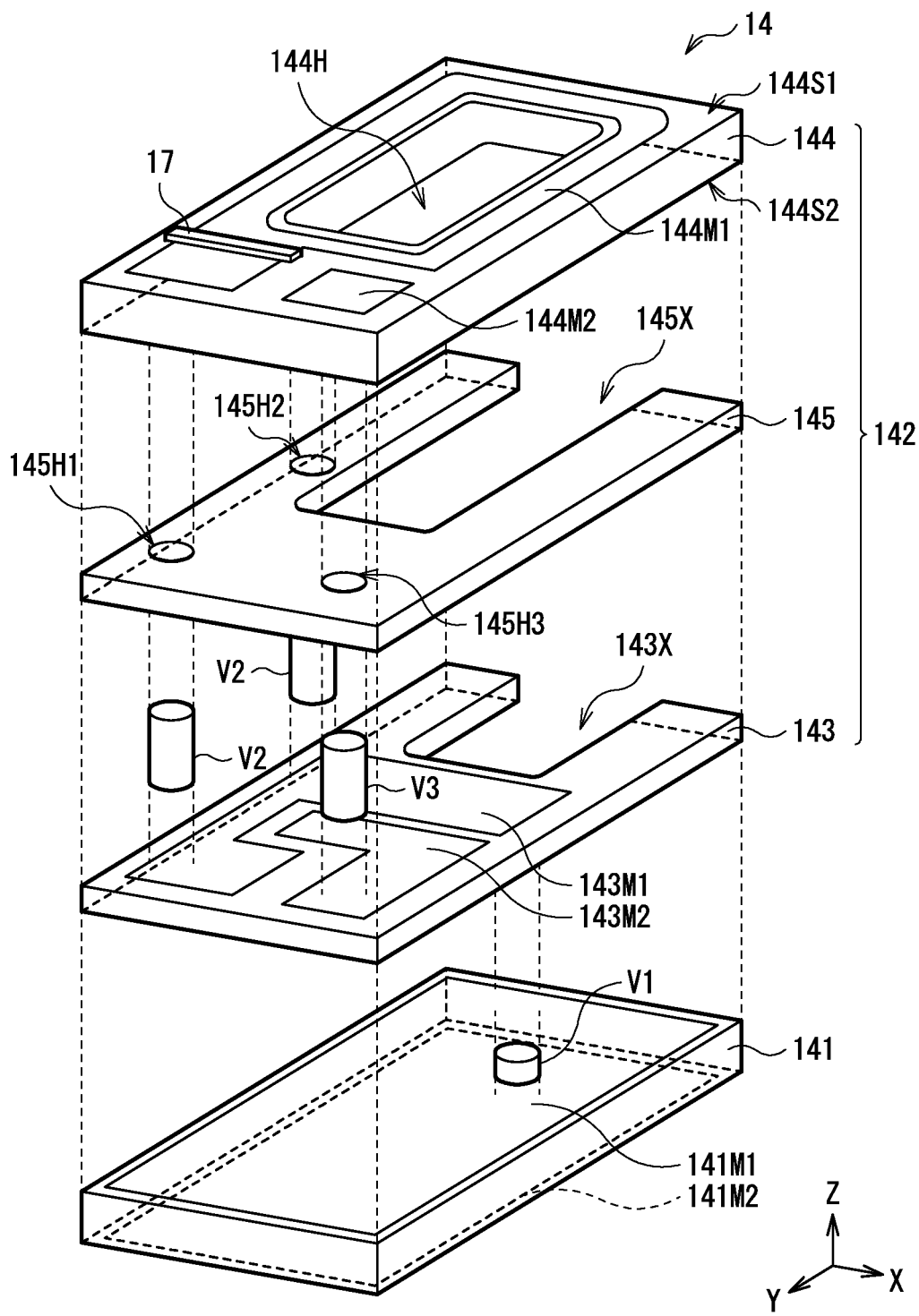

[ FIG. 25A ]
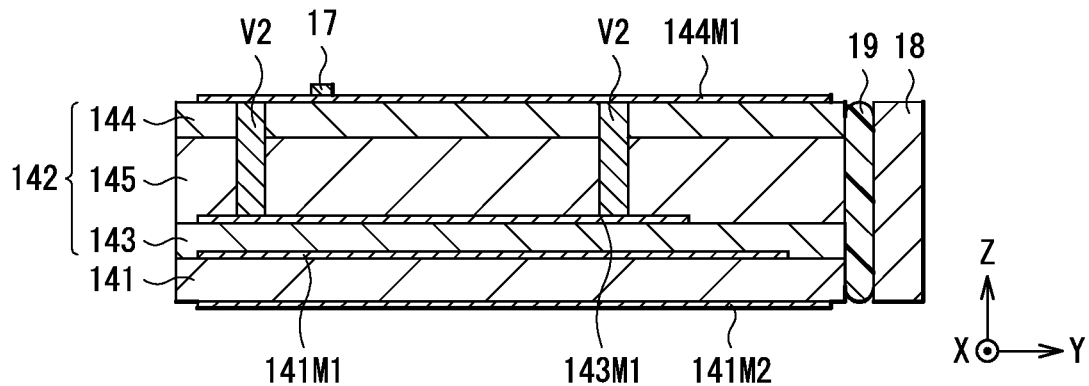
[ FIG. 25B ]
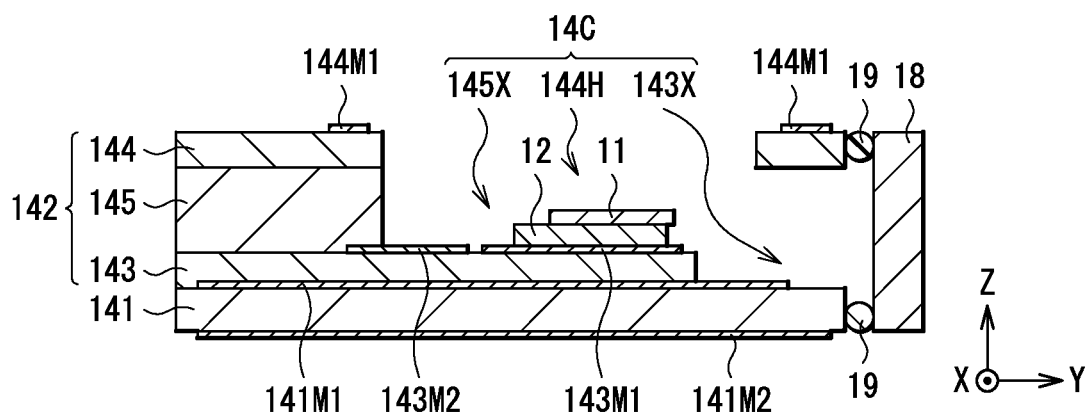
[ FIG. 25C ]
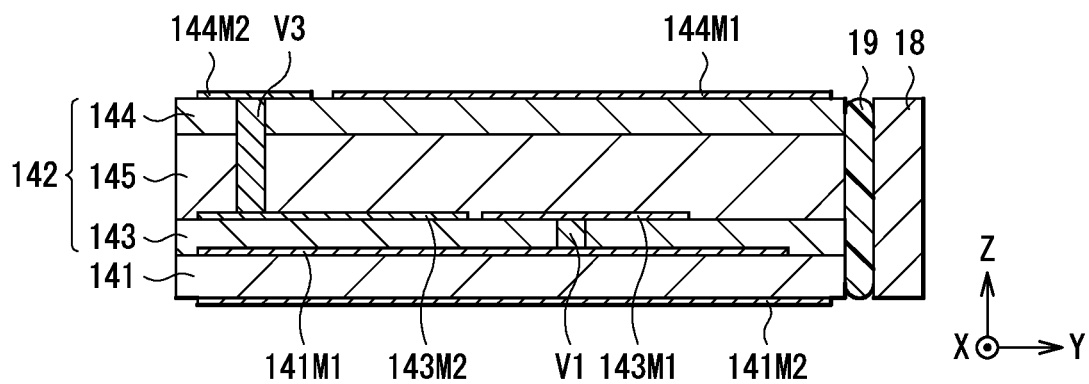

[ FIG. 26 ]
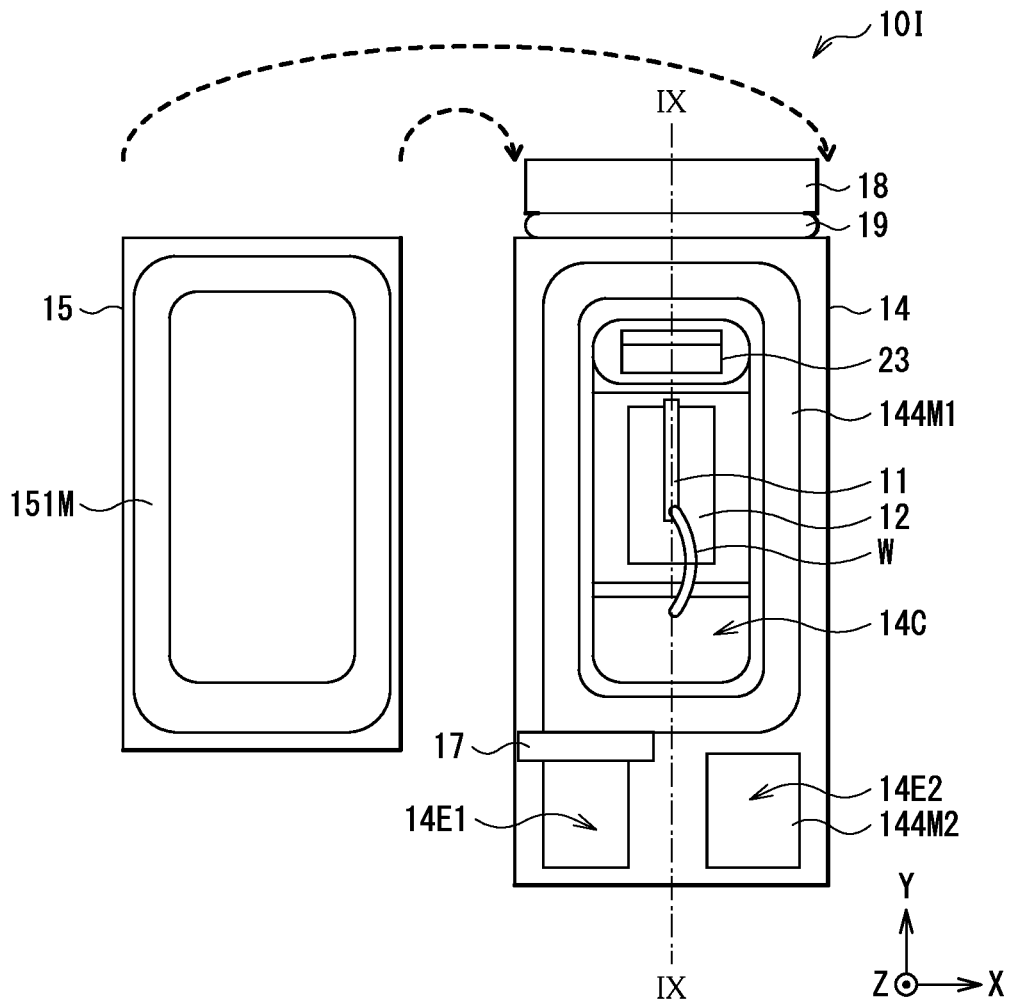
[ FIG. 27 ]
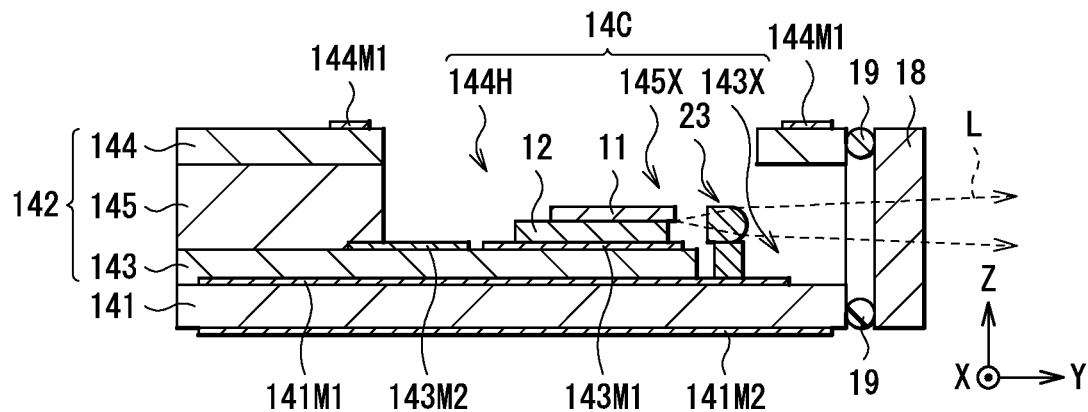

[ FIG. 28 ]
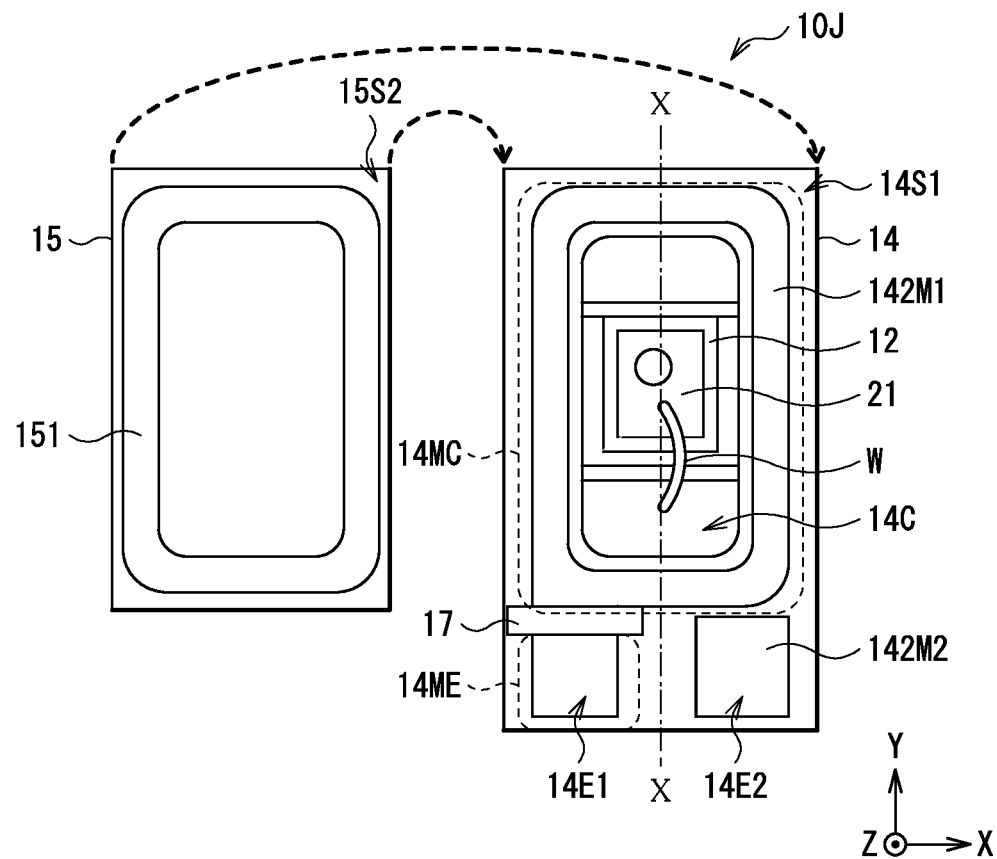
[ FIG. 29 ]
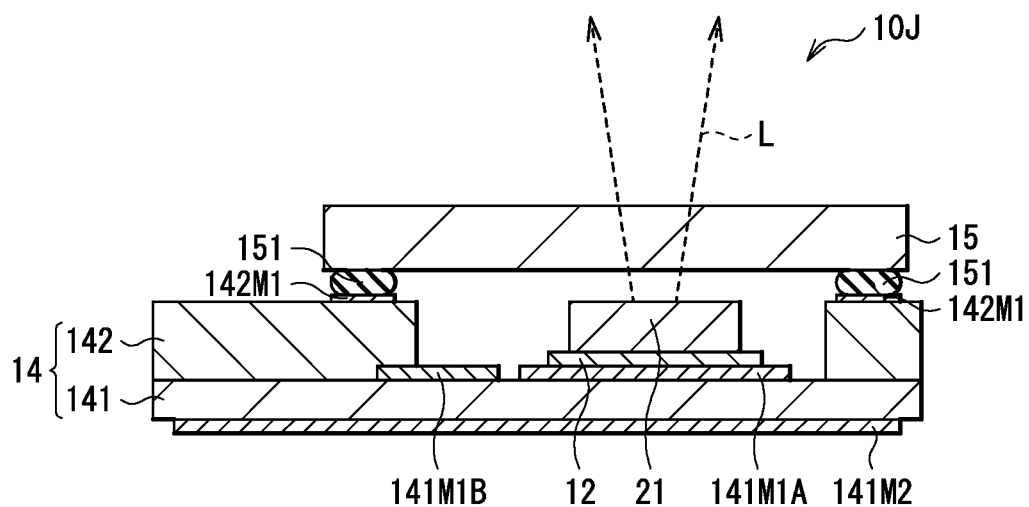

[ FIG. 30 ]
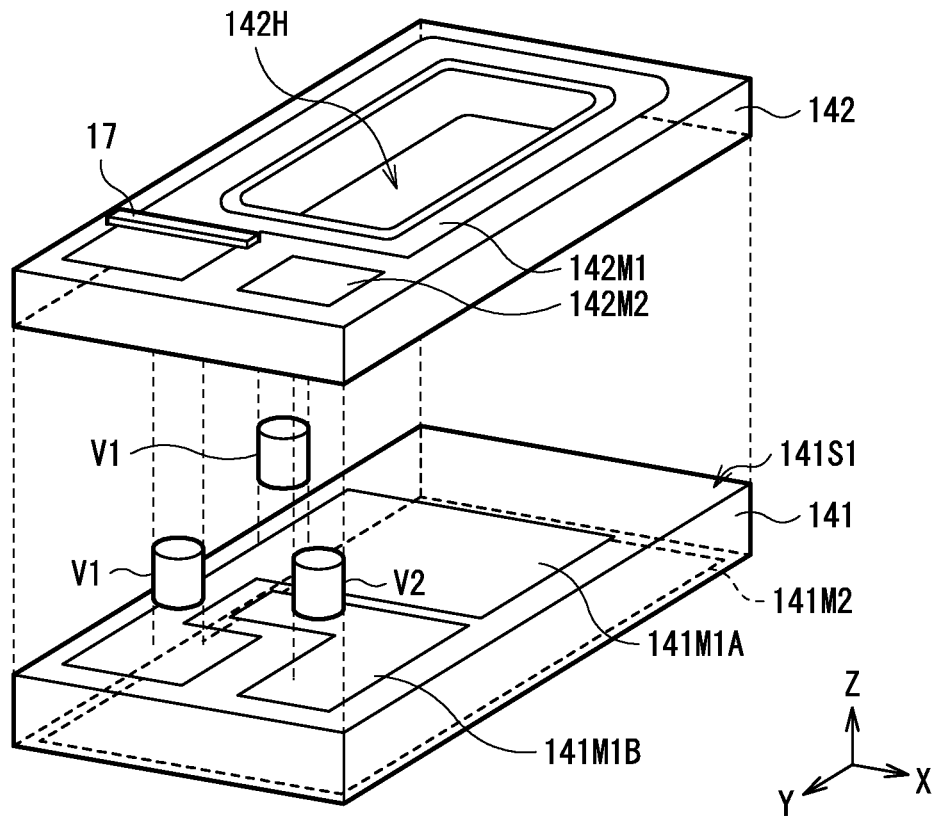
[ FIG. 31 ]
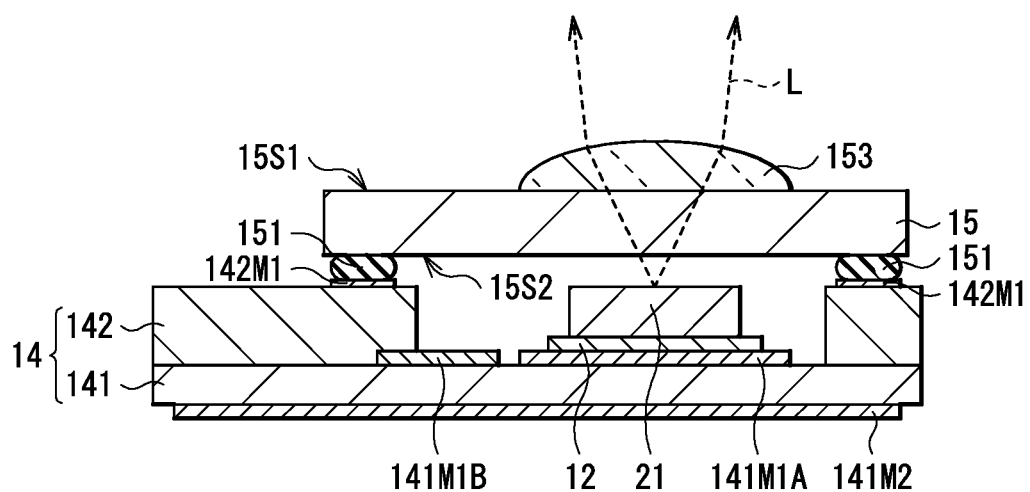

[ FIG. 32 ]
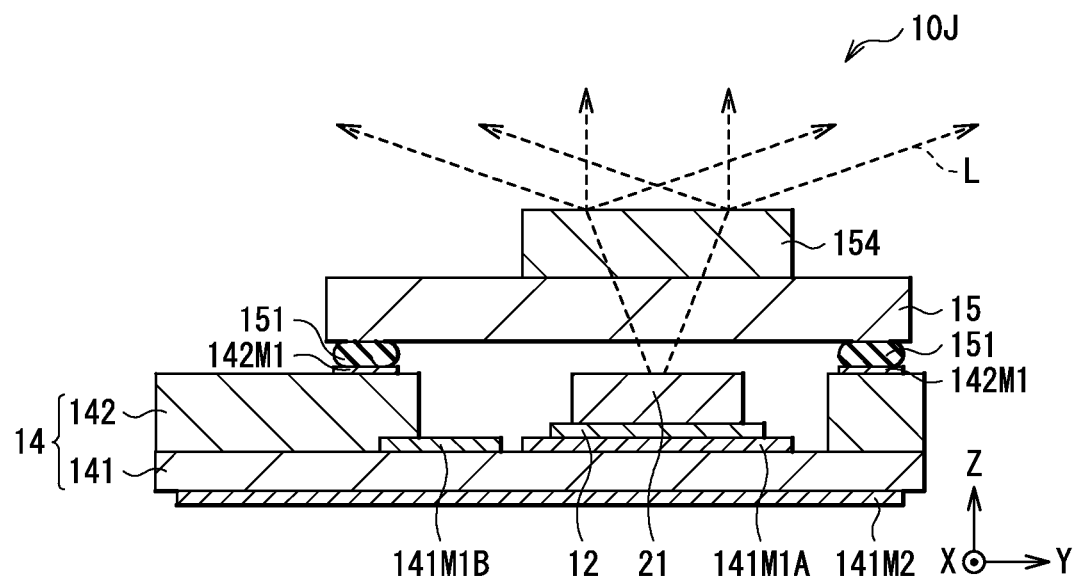

[ FIG. 33 ]
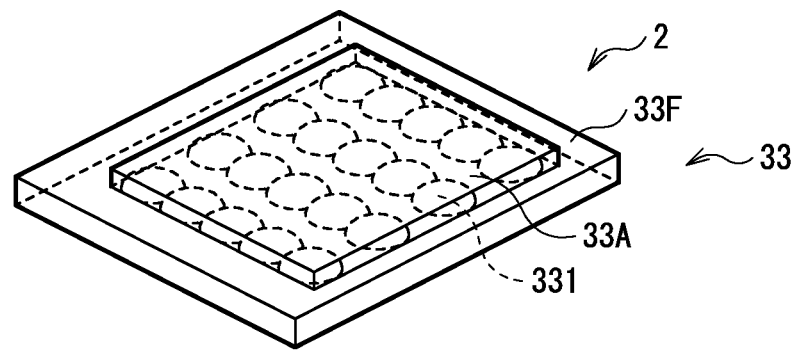
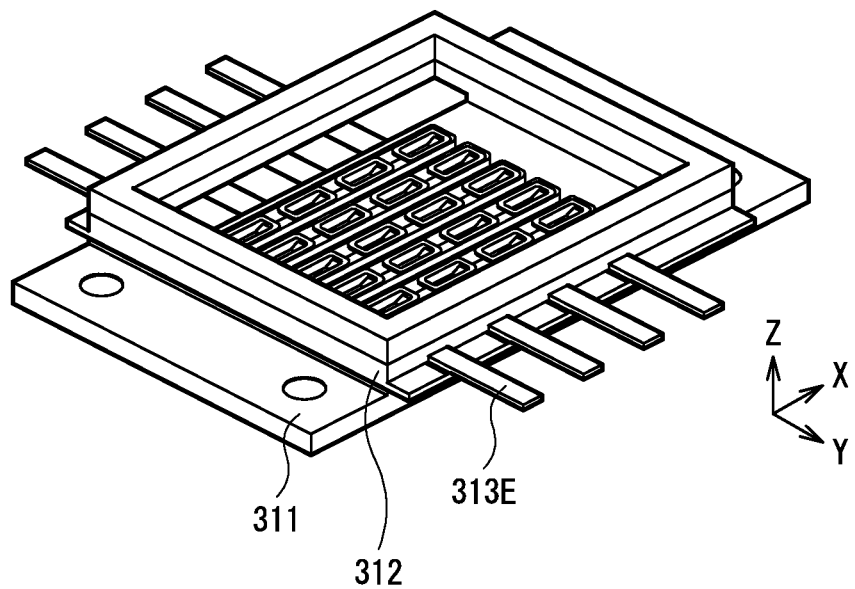

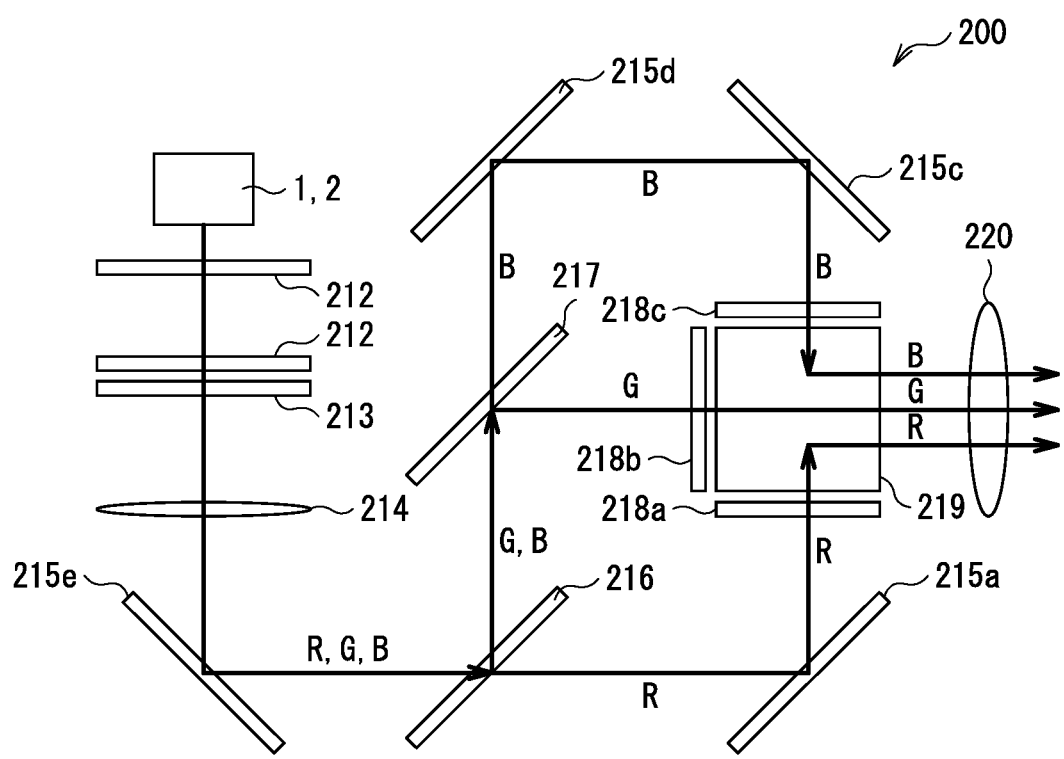
[ FIG. 34 ]

SEMICONDUCTOR LIGHT EMITTING DEVICE

TECHNICAL FIELD

The present technology relates to a semiconductor light emitting device including, for example, a light emitting element such as a semiconductor laser element.

BACKGROUND ART

Light emitting apparatuses each including a plurality of light emitting elements such as semiconductor laser elements are under development. A semiconductor laser element has the portion of the semiconductor laser chip packaged by a cap to secure reliability (see, for example, PTL 1).

CITATION LIST

Patent Literature

PTL 1: Japanese Unexamined Patent Application Publication No. H5-129711

SUMMARY OF THE INVENTION

Such a light emitting device is requested to have improved internal resistance.

It is desirable to provide a semiconductor light emitting device that allows the internal resistance to be improved.

A semiconductor light emitting device according to an embodiment of the present disclosure includes: a light emitting element: a first housing member and a second housing member at least one of which has a wiring structure; and an electrically conductive bonding section. The first housing member and the second housing member house the light emitting element. The wiring structure electrically couples the light emitting element and an outside. The electrically conductive bonding section bonds the first housing member and the second housing member. The electrically conductive bonding section is electrically coupled to the wiring structure.

In the semiconductor light emitting device according to the embodiment of the present disclosure, the electrically conductive bonding section is electrically coupled to the wiring structure provided in at least one of the first housing member or the second housing section, thereby increasing the cross-sectional area of a wiring line that electrically couples the light emitting element and the outside. The electrically conductive bonding section bonds the first housing member and the second housing member. The light emitting element is housed in the first housing member and the second housing member.

BRIEF DESCRIPTION OF DRAWING

FIG. 1 is an exploded perspective view of an example of a configuration of a semiconductor light emitting device according to a first embodiment of the present disclosure.

FIG. 2 is a plane schematic diagram illustrating an example of the configuration of the semiconductor light emitting device illustrated in FIG. 1.

FIG. 3 is an exploded perspective view of an example of a configuration of a housing member illustrated in FIG. 1.

FIG. 4A is a cross-sectional schematic diagram of the semiconductor light emitting device illustrated in FIG. 1 taken along an I-I line.

FIG. 4B is a cross-sectional schematic diagram of the semiconductor light emitting device illustrated in FIG. 1 taken along an II-II line.

FIG. 4C is a cross-sectional schematic diagram of the semiconductor light emitting device illustrated in FIG. 1 taken along an III-III line.

FIG. 5 is a side schematic diagram illustrating an example of a schematic configuration of a light emitting apparatus including the semiconductor light emitting device illustrated in FIG. 1.

FIG. 6 is an exploded perspective view of a schematic configuration of the light emitting apparatus illustrated in FIG. 5.

FIG. 7 is a perspective view for describing coupling between the semiconductor light emitting device and a terminal section of a lens holding member illustrated in FIG. 5.

FIG. 8 is a plane schematic diagram illustrating an example of a configuration of a semiconductor light emitting device according to a second embodiment of the present disclosure.

FIG. 9 is an exploded perspective view of an example of a configuration of a housing member illustrated in FIG. 8.

FIG. 10 is a plane schematic diagram illustrating an example of a configuration of a semiconductor light emitting device according to a third embodiment of the present disclosure.

FIG. 11 is an exploded perspective view of an example of a configuration of a housing member illustrated in FIG. 10.

FIG. 12A is a plane schematic diagram illustrating an example of a configuration of a semiconductor light emitting device according to a fourth embodiment of the present disclosure.

FIG. 12B is a plane schematic diagram illustrating an example of a front-side configuration of a cover illustrated in FIG. 12A.

FIG. 12C is a cross-sectional schematic diagram illustrating an example of a configuration of the cover illustrated in FIG. 12.

FIG. 13 is an exploded perspective view of an example of a configuration of a housing member illustrated in FIG. 12A.

FIG. 14A is a plane schematic diagram illustrating an example of a configuration of a semiconductor light emitting device according to a fifth embodiment of the present disclosure.

FIG. 14B is a cross-sectional schematic diagram illustrating an example of a configuration of a cover illustrated in FIG. 14A.

FIG. 15 is an exploded perspective view of an example of a configuration of a housing member illustrated in FIG. 14A.

FIG. 16 is a plane schematic diagram illustrating an example of a shape of a metal pattern illustrated in FIG. 15.

FIG. 17 is a plane schematic diagram illustrating an example of a configuration of a semiconductor light emitting device according to a sixth embodiment of the present disclosure.

FIG. 18 is an exploded perspective view of an example of a configuration of a housing member illustrated in FIG. 17.

FIG. 19 is a diagram illustrating an example of a shape of a metal pattern illustrated in FIG. 17.

FIG. 20 is a plane schematic diagram illustrating an example of a configuration of a semiconductor light emitting device according to a seventh embodiment of the present disclosure.

FIG. 21 is a plane schematic diagram illustrating an example of a configuration of a semiconductor light emitting device according to an eighth embodiment of the present disclosure.

FIG. 22 is an exploded perspective view of an example of a configuration of a housing member illustrated in FIG. 21.

FIG. 23 is a plane schematic diagram illustrating an example of a configuration of a semiconductor light emitting device according to a ninth embodiment of the present disclosure.

FIG. 24 is an exploded perspective view of an example of a configuration of a housing member illustrated in FIG. 23.

FIG. 25A is a cross-sectional schematic diagram of the semiconductor light emitting device illustrated in FIG. 23 taken along a VI-VI line.

FIG. 25B is a cross-sectional schematic diagram of the semiconductor light emitting device illustrated in FIG. 23 taken along a VII-VII line.

FIG. 25C is a cross-sectional schematic diagram of the semiconductor light emitting device illustrated in FIG. 23 taken along a VIII-VIII line.

FIG. 26 is a plane schematic diagram illustrating another example of the configuration of the semiconductor light emitting device according to the ninth embodiment of the present disclosure.

FIG. 27 is a cross-sectional schematic diagram of the semiconductor light emitting device illustrated in FIG. 26.

FIG. 28 is a plane schematic diagram illustrating an example of a configuration of a semiconductor light emitting device according to a tenth embodiment of the present disclosure.

FIG. 29 is a cross-sectional schematic diagram of the semiconductor light emitting device illustrated in FIG. 28.

FIG. 30 is an exploded perspective view of an example of a configuration of a housing member illustrated in FIG. 28.

FIG. 31 is a cross-sectional schematic diagram illustrating another example of the configuration of the semiconductor light emitting device according to the tenth embodiment of the present disclosure.

FIG. 32 is a cross-sectional schematic diagram illustrating another example of the configuration of the semiconductor light emitting device according to the tenth embodiment of the present disclosure.

FIG. 33 is an exploded perspective view of an example of a configuration of a light emitting apparatus according to a modification example of the present disclosure.

FIG. 34 is a diagram illustrating an example of a configuration of a projection display to which the light emitting apparatus illustrated in FIG. 1 or the like is applied.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not limited to the disposition, dimensions, dimensional ratios, or the like of the respective components illustrated in the drawings. It is to be noted that description is given in the following order.

1. First Embodiment (Example in which a bonding member for a housing member and a cover is used as an electrical conduction path)
    1-1. Configuration of Semiconductor Light Emitting Device
    1-2. Configuration of Light Emitting Apparatus
    1-3. Workings and Effects
2. Second Embodiment (Example in which the metal pattern on the bonded surface of a housing member is separated into a metal pattern for an electrode extraction section and a bonding metal pattern)
3. Third Embodiment (Example in which a solder stop band is provided on the border between a metal pattern for an electrode extraction section and a bonding metal pattern)
4. Fourth Embodiment (Example in which an electrode extraction section is provided on the upper surface of a cover)
5. Fifth Embodiment (Example in which a recessed section is provided on a cover side)
6. Sixth Embodiment (Example in which a light emitting element and a mirror are disposed in the same plane)
7. Seventh Embodiment (Example in which a metal pattern for electrode extraction and a bonding metal pattern are electrically coupled by using a solder pattern on a cover side)
8. Eighth Embodiment (Example in which a ground pattern is provided)
9. Ninth Embodiment (Example in which light is emitted in the horizontal direction)
10. Tenth Embodiment (Example in which a vertical resonator surface emitting laser is used)
11. Modification Examples (Another example of a configuration of a display)
12. Application Example (Example of a projection display)

1. First Embodiment

FIG. 1 is an exploded perspective view of an example of a configuration of a semiconductor light emitting device (semiconductor light emitting device 10A) according to a first embodiment of the present disclosure. FIG. 2 schematically illustrates an example of a planar configuration of the semiconductor light emitting device 10A illustrated in FIG. 1. The semiconductor light emitting device 10A is a packaged surface mount device (surface mount device: SMD). The semiconductor light emitting device 10A includes a light emitting element 11, a housing member 14, and a cover 15. The housing member 14 includes a recessed section 14C and the light emitting element 11 is housed in this recessed section 14C. The housing member 14 and the cover 15 are bonded with a bonding member 16 interposed in between. This hermetically seals the light emitting element 11. This housing member 14 corresponds to a specific example of a "first housing member" of the present disclosure and the cover 15 corresponds to a specific example of a "second housing member" of the present disclosure.

(1-1. Configuration of Semiconductor Light Emitting Device)

In the semiconductor light emitting device 10A according to the present embodiment, the light emitting element 11 is housed in the recessed section 14C of the housing member 14, for example, along with a submount 12 and a mirror 13. The housing member 14 is bonded to the cover 15 with the bonding member 16 interposed in between and seals the light emitting element 11, the submount 12, and the mirror 13 along with the cover 15. The housing member 14 is provided with a wiring structure for electrically coupling the light emitting element 11 and the outside. The bonding member 16 is electrically coupled to this wiring structure. Along with the wiring structure, the bonding member 16 is included in an electrical conduction path that electrically couples the light emitting element 11 and the outside.

The light emitting element 11 includes, for example, a semiconductor laser element such as LD (Laser Diode). The light emitting element 11 includes, for example, a gallium nitride (GaN)-based semiconductor material and emits light in the blue wavelength range. A wavelength conversion member such as a fluorescent material may be disposed in the optical path of the light emitted from the light emitting element 11. The light emitting element 11 may include, for example, a semiconductor material such as a gallium arsenide (GaAs)-based material. One (e.g., anode) of the anode and the cathode of the light emitting element 11 is coupled to the wiring structure provided in the housing member 14 described below by wire bonding and extracted, for example, from an electrode extraction section 14E2. For example, a wire W is used in the wire bonding. The wire W includes, for example, gold (Au). One (e.g., cathode) of the anode and the cathode of the light emitting element 11 is extracted, for example, from an electrode extraction section 14E1 through the wiring structure provided in the housing member 14 without using the wire W, for example, in a case where the electrically conductive submount 12 described below is used.

The submount 12 is for mounting the light emitting element 11. The submount 12 is provided between the light emitting element 11 and the bottom surface of the recessed section 14C of the housing member 14. The submount 12 is, for example, a plate-shaped member. The position of the light emitting element 11 may be adjusted in accordance with the thickness of the submount 12 (size in the Z direction in FIG. 1). The submount 12 includes, for example, an insulating material such as aluminum nitride (AlN), silicon (Si), silicon carbide (SiC), diamond, or beryllium oxide (BeO). In a case where the submount 12 including an insulating material is used, a wire is coupled from a metal pattern (not illustrated) on the submount 12 to a metal pattern 143M1 or a metal pattern 141M1. This electrically couples, for example the electrode extraction section 14E1 and the light emitting element 11.

The submount 12 may include, for example, an electrically conductive material such as copper tungsten (Cu—W), copper molybdenum (Cu—Mo), copper diamond, and graphite. The use of the electrically conductive submount 12 makes it possible to cause one (e.g., cathode) of the electrodes of the light emitting element 11 to be conducted to the wiring structure inside the housing member 14 through the submount 12. This decreases the wires W in number as compared with a case where the anode and the cathode of the light emitting element 11 are both coupled, for example, to an electrode extraction section 14E by using the wires W. It is thus possible to decrease the semiconductor light emitting device 10A in size.

The light emitting element 11 is eutectically bonded to the submount 12, for example, by AuSn (gold-tin) and the submount 12 is eutectically bonded to the bottom surface of the recessed section 14C of the housing member 14, for example, by AuSn. The submount 12 may also be bonded to the bottom surface of the recessed section 14C of the housing member 14, for example, by silver (Ag) paste, sintered gold (Au), sintered silver (Ag), or the like.

The mirror 13 is for reflecting the light emitted from the light emitting element 11. The light emitted from the light emitting element 11 is reflected by the mirror 13 and emitted from the cover 15 side. The mirror 13 is provided in the recessed section 14C of the housing member 14 along with the light emitting element 11 mounted on the submount 12. The recessed section 14C is provided, for example, with a step inside. The mirror 13 is disposed at a lower position than that of the light emitting element 11.

The mirror 13 has, for example, an inclined surface. This inclined surface is disposed to be opposed to the light emitting surface of the light emitting element 11. The inclined surface of the mirror 13 is inclined, for example, by 45° from the bottom surface of the housing member 14. This allows the light reflected by the inclined surface of the mirror 13 to be extracted in the direction vertical to the bottom surface of the housing member 14. Adjusting the angle of the inclined surface of the mirror 13 also allows the light extraction direction to be changed. The mirror 13 includes, for example, glass, synthetic quartz, silicon, sapphire, copper, aluminum, or the like. The inclined surface of the mirror 13 may be provided, for example, with a reflective film such as a metal film or a dielectric multilayered film. This reflective film has, for example, a reflectance of 90% or more for the light emitted from the light emitting element 11. The reflective film preferably has a reflectance of 99% or more.

FIG. 3 is an exploded perspective view of an example of a configuration of the housing member 14 illustrated in FIG. 1. FIGS. 4A to 4C schematically illustrate cross-sectional configurations of the housing member 14 taken along an I-I line, an II-II line, and an III-III line illustrated in FIG. 2. The housing member 14 houses the light emitting element 11 mounted on the submount 12 and the mirror 13 and seals the light emitting element 11 and the mirror 13 along with the cover 15. In other words, the recessed section 14C of the housing member 14 and the cover 15 form a housing space having airtightness. The recessed section 14C has, for example, a rectangular planar shape. The housing member 14 includes, for example, glass or ceramic. The housing member 14 includes, for example, a sintered compact such as aluminum nitride (AlN), aluminum oxide (alumina), or silicon carbide (SiC).

The housing member 14 includes a first layer 141 and a second layer 142. The first layer 141 is included in the bottom surface of the recessed section 14C. The second layer 142 is included in the side surface of the recessed section 14C. The second layer 142 includes a bonding layer 144 and an intermediate layer 143. The bonding layer 144 is bonded to the cover. The intermediate layer 143 is disposed between the first layer 141 and the bonding layer 144. Metal patterns 141M, 143M, and 144M are each formed on the first layer 141 and the second layer 142 (specifically, the intermediate layer 143 and the bonding layer 144) and electrically coupled as appropriate. Each of the metal patterns 141M, 143M, and 144M includes, for example, gold (Au) or the like. This first layer 141 corresponds to a specific example of a "first layer" of the present disclosure and the second layer 142 corresponds to a specific example of a "second layer" of the present disclosure.

As described above, the first layer 141 is included in the bottom surface of the recessed section 14C. The first layer 141 is, for example, a plate member having a rectangular planar shape. The first layer 141 has an upper surface 141S1 and a lower surface 141S2 that are opposed to each other. This upper surface 141S1 is included in a portion of the bottom surface of the recessed section 14C. The lower surface 141S2 is included in a back surface 14S2 of the housing member 14. The upper surface 141S1 is provided with the metal pattern 141M1. The metal pattern 141M1 is used, for example, to mount the mirror 13. The metal pattern 141M1 is provided to partially correspond to an opening 143H, for example, in a plan (XY plane) view. The opening 143H is provided in the intermediate layer 143 described below. Specifically, the metal pattern 141M1 is provided to be exposed in the opening 143H. This allows the mirror 13 to efficiently dissipate heat. In addition, it is possible to facilitate soldering onto the mirror 13.

The lower surface 141S2 of the first layer 141 is provided with a metal pattern 141M2 for mounting on a base plate 31 described below. This metal pattern 141M2 also functions as a heat dissipation member and also allows the heat generated by the light emitting element 11 to be efficiently dissipated to the base plate 31. In other words, providing the metal pattern 141M2 on the back surface 14S2 of the housing member 14 makes it possible to electrically and thermally couple the semiconductor light emitting device 10A and the base plate 31.

As described above, the intermediate layer 143 is included in a portion of the side surface of the recessed section 14C and disposed between the first layer 141 and the bonding layer 144. The intermediate layer 143 is, for example, a plate member having a rectangular planar shape. The intermediate layer 143 has an upper surface 143S1 and a lower surface 143S2 that are opposed to each other. This upper surface 143S1 is included in the bottom surface of the recessed section 14C along with the upper surface 141S1 of the first layer 141. The intermediate layer 143 is provided with the opening 143H in which the mirror 13 is disposed. The metal pattern 141M1 provided on the upper surface of the first layer 141 is exposed in the opening 143H. The mirror 13 is mounted through the metal pattern 141M1.

The upper surface 143S1 of the intermediate layer 143 is provided with the metal pattern 143M1 and a metal pattern 143M2 that are independent from each other. The metal pattern 143M1 is used, for example, to mount the submount 12. The metal pattern 143M1 is patterned to overlap at least partially, for example, with at least any one of the metal pattern 141M1 provided on the first layer 141 or a metal pattern 144M1 provided on the bonding layer 144 described below in a plan view. In addition, the metal pattern 143M1 is provided to be partially exposed in an opening 144H provided in the bonding layer 144 and mounted with the submount 12. This allows the submount 12 to efficiently dissipate heat. In addition, it is possible to facilitate soldering onto the submount 12. The metal pattern 143M2 is patterned to at least partially overlap with a metal pattern 144M2 provided on the bonding layer 144, for example, in a plan view.

The intermediate layer 143 is further provided with a via V1 that penetrates the intermediate layer 143 in the Z axis direction. The via V1 is provided with the position overlapping with the metal pattern 143M1 and the metal pattern 141M1 on the first layer 141 and couples the metal pattern 141M1 and the metal pattern 143M1. Providing this via V1 facilitates electroplating treatment in gold plating treatment described below. In addition, providing the via V1 makes it possible to electrically couple, for example, the electrode extraction section 14E1 and the light emitting element 11 by coupling a wire from the metal pattern (not illustrated) on the submount 12 to the metal pattern 141M1 in a case where an insulating material is used for the submount 12.

As described above, the bonding layer 144 is included in a portion of the side surface of the recessed section 14C and bonded to the cover 15. The bonding layer 144 is, for example, a plate member having a rectangular planar shape. The bonding layer 144 has an upper surface 144S1 and a lower surface 144S2 that are opposed to each other. This upper surface 144S1 is included in a bonded surface 14S1 of the housing member 14 to the cover 15. The bonding layer 144 is provided with the opening 144H in which the submount 12 is disposed. Portions of the metal pattern 143M1 and the metal pattern 143M2 provided on the upper surface of the intermediate layer 143 are exposed in the opening 144H. The submount 12 is mounted through the metal pattern 143M1. The metal pattern 143M2 is electrically coupled to one (e.g., anode) of the electrodes of the light emitting element 11 mounted on the submount 12 through the wire W. In addition, the opening 144H includes the opening 143H provided in the intermediate layer 143. In other words, the recessed section 14C includes the opening 143H and the opening 144H. This causes the bottom surface of the recessed section 14C to have a step.

The upper surface 144S1 of the bonding layer 144 is provided with the metal pattern 144M1 that surrounds the opening 144H along the edge and partially protrudes to the outside of the edge. This portion (metal pattern 14MC) along the edge is used to bond the cover 15 (specifically, a solder pattern 151M described below). The protruding portion (metal pattern 14ME) is exposed from the cover 15. The protruding portion (metal pattern 14ME) is included in the electrode extraction section 14E1 that electrically couples the light emitting element 11 and the outside. In other words, the metal pattern 144M1 includes the metal pattern 14MC and the metal pattern 14ME. The upper surface 144S1 of the bonding layer 144 is further provided with the metal pattern 144M2 independent from the metal pattern 144M1, for example, next to the protruding portion (metal pattern 14ME) of the metal pattern 144M1. The metal pattern 144M2 is exposed from the cover 15 along with the metal pattern 14ME. The metal pattern 144M2 is included in the electrode extraction section 14E2 that electrically couples the light emitting element 11 and the outside. The electrode extraction section 14E1 and the electrode extraction section 14E2 are portions where the electrodes are drawn out from the anode and the cathode of the light emitting element 11.

The bonding layer 144 is further provided, for example, with three vias V2 and one via V3 that penetrate the bonding layer 144 in the Z axis direction. The three vias V2 are provided at the positions overlapping with the metal pattern 144M1 and the metal pattern 143M1 on the intermediate layer 143. Specifically, the two vias V2 of the three vias V2 are provided immediately below the metal pattern 14MC and the one via V2 is provided immediately below the metal pattern 14ME. In other words, the metal pattern 14MC is coupled to the metal pattern 143M1 by the two vias V2 and the metal pattern 14ME is coupled to the metal pattern 143M1 by the one via V2. The one via V3 is provided with the position overlapping with the metal pattern 144M2 and the metal pattern 143M2 on the intermediate layer 143 and couples the metal pattern 143M2 and the metal pattern 144M2.

As described above, the anode and the cathode of the light emitting element 11 are drawn out from the electrode extraction section 14E1 and the electrode extraction section 14E2 exposed from the cover 15 through the metal patterns 141M, 143M, and 144M provided on the first layer 141 and the second layer 142 and the vias V1, V2, and V3. Specifically, the cathode of the light emitting element 11 is drawn out from the electrode extraction section 14E1, for example, through the metal pattern 141M1, the via V1, the metal pattern 143M1, and the one via V2 and the metal pattern 141M1, the via V1, the metal pattern 143M1, the two vias V2, and the metal pattern 14MC. The anode of the light emitting element 11 is drawn out from the electrode extraction section 14E2, for example, through the wire W, the metal pattern 143M2, and the via V3.

The light emitted from the light emitting element 11 is extracted from the cover 15. The cover 15 is, for example, a plate member having a rectangular planar shape. The cover 15 has an upper surface 15S1 and a lower surface 15S2 that are opposed to each other. The cover 15 covers at least the recessed section 14C of the housing member 14. The lower surface 15S2 of the cover 15 is coated with the solder pattern 151M with an adhesive layer interposed in between. The adhesive layer includes chromium (Cr), titanium (Ti), gold (Au), or the like. This solder pattern 151M has substantially the same planar shape, for example, as that of the bonding metal pattern 14MC portion formed on the bonded surface 14S1 of the housing member 14. Specifically, the solder pattern 151M has the shape of a frame that surrounds the recessed section 14C. The width of the solder pattern 151M is substantially the same as that of a bonding metal pattern 144MC formed on the upper surface of the housing member 14 or the solder pattern 151M has a width less than or equal to that of the bonding metal pattern 144MC. The solder pattern 151M is formed by using, for example, SnAgCu (tin-silver-copper)-based solder. AuSn (gold-tin)-based solder, Sn (tin)-based solder, In (indium)-based solder, or the like may be used for the solder pattern 151M. The use of such soldering or the like hermetically seals (hermetic seal) the light emitting element 11 or the like between the housing member 14 and the cover 15. The cover 15 includes a material that has light transmissivity at the portion covering at least the recessed section 14C. Specifically, the cover 15 includes, for example, glass or the like.

The bonding member 16 is for bonding the housing member 14 and the cover 15. The bonding member 16 includes, for example, the metal pattern 14MC and the solder pattern 151M. The metal pattern 14MC is provided on the bonded surface 14S1 of the housing member 14. The solder pattern 151M is provided on the lower surface 15S2 of the cover 15. The metal pattern 14MC is a portion of the metal pattern 144M1. The metal pattern 144M1 includes the metal pattern 14ME included in the electrode extraction section 14E1 in addition to the metal pattern 14MC. In other words, the metal pattern 14MC and the metal pattern 14ME are formed in the same metal pattern (metal pattern 144M1) and electrically coupled to each other. In addition, the metal pattern 14MC is coupled to the metal pattern 143M1 through the two vias V2. The metal pattern 143M1 is electrically coupled, for example, to the cathode of the light emitting element 11, for example, through the submount 12. In other words, the metal pattern 14MC is included, for example, in a portion of the electrical conduction path between the cathode of the light emitting element 11 and the electrode extraction section 14E1. This increases the cross-sectional area of the electrical conduction path that electrically couples the light emitting element 11 and the outside (e.g., electrode extraction section 14E1) and reduces the internal resistance.

The semiconductor light emitting device 10A is manufactured, for example, as follows. Specifically, the metal pattern 141M and the metal pattern 141M2 are formed on the upper surface 141S1 and the lower surface 141S2 of the first layer 141. Next, the second layer 142 is formed. First, the opening 143H included in the recessed section 14C and a through hole (not illustrated) for the via V1 are formed in the intermediate layer 143. Subsequently, the via V1 is formed by filling the through hole, for example, with tungsten paste, copper (Cu), or silver (Ag) and the metal pattern 143M1 and the metal pattern 143M2 are then formed on the upper surface 143S1 of the intermediate layer 143. Next, the opening 144H included in the recessed section 14C and a through hole (not illustrated) for the vias V2 and V3 are formed in the bonding layer 144. Subsequently, the vias V2 and V3 are formed by filling the through hole, for example, with tungsten paste, copper (Cu), or silver (Ag) and the metal pattern 144M1 and the metal pattern 144M2 are then formed on the upper surface 144S1 of the bonding layer 144. After that, sintering is performed, gold plating treatment is performed on the exposed portion, and singulation is then performed to form the housing member 14. Next, after the submount 12, the light emitting element 11, and the mirror 13 are disposed in the recessed section 14C of the housing member 14, for example, the anode of the light emitting element 11 and the metal pattern 143M2 are coupled by wire bonding. For example, a gold wire (wire W) is used in the wire bonding. In addition, in a case where an insulating material is used for the submount 12, a wire is coupled from a metal pattern (not illustrated) on the submount 12 to a metal pattern 143M1 or a metal pattern 141M1. This electrically couples, for example the electrode extraction section 14E1 and the light emitting element 11. Finally, the cover 15 is bonded to the housing member 14. This hermetically seals the light emitting element 11 to complete the semiconductor light emitting device 10A.

In the manufacturing step of the semiconductor light emitting device 10A described above, the melting temperature of bonding agents is of importance in the three steps of mounting the mirror 13, mounting the light emitting element 11 and the submount 12, and bonding the housing member 14 and the cover 15. For example, the mirror 13 is preferably bonded by using AuSn solder or sintering Ag paste as a bonding agent. The light emitting element 11 and the submount 12 are preferably bonded by using AuSn solder as a bonding agent. The housing member and the cover 15 are preferably bonded by using SnAgCu solder as a bonding agent. The combinations described above prevent the bonding agents from remelting in the respective steps, making it possible to secure the mounting accuracy. It is to be noted that, in a case where AuSn solder is used to mount the mirror 13, the AuSn solder that melts in mounting the mirror 13 may take in, for example, the gold plate applied to the metal pattern exposed in the recessed section 14C of the housing member 14 and increase the melting temperature. It is possible to prevent this remelting by appropriately setting the melting temperature of the AuSn solder to mount the light emitting element 11 and the submount 12.

In the semiconductor light emitting device 10A, light is extracted, for example, as follows. The light (e.g., light in the blue wavelength range) emitted from the light emitting element 11 is reflected by the mirror 13, transmitted by the cover 15, and extracted from the semiconductor light emitting device 10A.

(1-2. Configuration of Light Emitting Apparatus)

FIG. 5 illustrates a schematic configuration of the side surface of a light emitting apparatus (light emitting apparatus 1) including the semiconductor light emitting device 10A illustrated in FIG. 1. FIG. 6 is an exploded perspective view of the light emitting apparatus 1 illustrated in FIG. 5. The light emitting apparatus 1 includes the semiconductor light emitting device 10A, the base plate 31, a lens holding member 32, and an array lens 33. The array lens 33 includes a lens 331 corresponding to each of the semiconductor light emitting devices 10A.

The base plate 31 is a member for placing the semiconductor light emitting device 10A. The base plate 31 is, for example, a flat member. The base plate 31 has a front surface 31A and a back surface 31B that are opposed to each other. The front surface 31A is provided with the plurality of semiconductor light emitting devices 10A and the back surface 31B is thermally coupled, for example, to a heat sink or the like (not illustrated).

The base plate 31 includes, for example, a ceramic material, a metal material, or the like. The base plate 31 including a metal material is able to increase heat dissipation. Examples of the metal material include iron (Fe), iron alloy, copper (Cu), aluminum (Al), copper alloy, and the like. Examples of the copper alloy include copper tungsten (CuW) and the like. Examples of the ceramic material include aluminum nitride (AlN) and the like. The base plate 31 may be provided with a coolant channel.

The base plate 31 may be provided with a recessed section for placing the semiconductor light emitting device 10A. Providing the semiconductor light emitting device 10A in the recessed section of the base plate 31 allows the semiconductor light emitting device 10A to be protected.

The plurality of semiconductor light emitting devices 10A is placed on the front surface 31A of the base plate 31. The plurality of semiconductor light emitting devices 10A is disposed, for example, in a matrix on the front surface 31A of the base plate 31 (in the X direction and the Y direction of FIG. 6). For example, a portion of the semiconductor light emitting devices 10A disposed in a matrix may be missing. This missing portion of the semiconductor light emitting devices 10A is, for example, for the purpose of removing a defective product or the purpose of reducing a portion of the power density in the surface. The semiconductor light emitting devices 10A may be disposed, for example, in another form such as a substantially hexagonal shape or a houndstooth shape.

The intervals between the plurality of semiconductor light emitting devices 10A disposed in a matrix on the front surface 31A of the base plate 31 are smaller, for example, in the θ-parallel direction than in the θ-perpendicular direction. The FFP (Far Field Pattern) half-value width in the θ-parallel direction is narrower than the FFP half-value width in the θ-perpendicular direction. It is thus possible to decrease the intervals between the semiconductor light emitting devices 10A in the θ-parallel direction. This makes it possible to increase the light density. The plurality of semiconductor light emitting devices 10A may be disposed in a line.

The lens holding member 32 provided between the base plate 31 and the array lens 33 has, for example, the shape of a frame that surrounds the plurality of semiconductor light emitting devices 10A placed on the front surface 31A of the base plate 31 (FIG. 6). In other words, the plurality of semiconductor light emitting devices 10A is provided inside the frame-shaped lens holding member 32. The planar shape of the lens holding member 32 is, for example, a quadrangular shape. This lens holding member 32 includes, for example, a holding section 321 having a quadrangular frame shape and an expanded section 322 expanded on the inside and the outside of the holding section 321. The expanded section 322 is provided, for example, on two opposed sides of the quadrangular holding section 321. The lens holding member 32 does not have to be provided over the entire circumference of the base plate 31, but may be provided, for example, on three sides of the quadrangular base plate 31. Alternatively, the lens holding member 32 may be provided on two opposed sides of the quadrangular base plate 31.

The lens holding member 32 is fixed to the base plate 31 by using, for example, a screw or the like (not illustrated). A method of fixing the lens holding member 32 to the base plate 31 may be any method. For example, adhesive may be used to fix the lens holding member 32 to the base plate 31. The adhesive includes, for example, a resin material. Alternatively, the lens holding member 32 and the base plate 31 may be collectively molded by using an insert molding process or the like.

The thickness of the holding section 321 (size in the Z direction in FIG. 6) is, for example, greater than the thickness of the expanded section 322. This holding section 321 is in contact with the base plate 31 and the array lens 33. The distance between each of the semiconductor light emitting devices 10A and the lens 331 is thus adjusted in accordance with the thickness of the holding section 321. The thickness of the holding section 321 is preferably large enough to maintain spaces between the cover 15 and the array lens 33 and between the base plate 31 and the array lens 33. The spaces are large enough to allow gas to flow. The size of a space that is large enough to allow gas to flow is, for example, about 0.01 mm. This is a machining tolerance. Alternatively, the size of a space that is large enough to allow gas to flow is about 0.5 mm. This is a tolerance in resin molding. In a case where the cover 15 and the array lens 33 are too close to each other, a desorbed matter caused by adhesive or the like stays in between. In a case where this desorbed matter reacts with light and is adsorbed on the cover 15 or the array lens 33, the optical characteristics are decreased. Providing a space that is large enough to allow gas to flow between the cover 15 and the array lens 33 makes it possible to suppress such a decrease in the optical characteristics. The holding section 321 has a thickness of about 1 mm to 30 mm, for example. It is sufficient if the thickness of the holding section 321 is adjusted, for example, in accordance with the focal distance of the lens 331, the optical path length in the semiconductor light emitting device 10A, and the like. The holding section 321 includes, for example, a resin material.

The expanded section 322 is provided, for example, with a terminal section 322E. This terminal section 322E is for electrically coupling the semiconductor light emitting device 10A (light emitting element 11) to the outside, for example, through a wiring line WA. The plurality of terminal sections 322E is provided from the inside to the outside of the expanded section 322. The terminal section 322E includes, for example, an electrically conductive metal material such as aluminum (Al). The portion of the expanded section 322 other than the terminal section 322E includes, for example, the same resin material as that of the holding section 321. The expanded section 322 and the holding section 321 may include different resin materials.

The holding section 321 and the expanded section 322 may be individually fixed to the base plate 31. In addition, in a case of the holding section 321 and the expanded section 322, the holding section 321 may be fixed to the expanded section 322. For example, the holding section 321 includes resin or metal. The expanded section 322 and the terminal section 322E each include PCB (Printed Circuit Board). This allows the holding section 321 to adhere to the base plate 31 or the expanded section 322 by using UV adhesive or solder. In addition, the array lens 33 and the holding section 321 may be integrally molded by using an insert molding method. The lens holding member 32 may include a metal material such as aluminum (Al), SUS (Steel Use Stainless), iron (Fe), and copper (Cu). Alternatively, the lens holding member 32 may include a ceramic material or the like. The shape of the lens holding member 32 may be formed by machining such as cutting or formed by die casting, sintering, or the like. The lens holding member 32 including the terminal section 322E preferably includes, for example, one component that is integrated by integral molding. This makes it possible to suppress the cost.

The array lens 33 is opposed to the base plate 31 with the plurality of semiconductor light emitting devices 10A interposed in between. This array lens 33 includes, for example, an array section 33A in the middle portion and a frame section 33F surrounding this array section 33A. In the array section 33A, the plurality of lenses 331 is provided at positions opposed to the respective semiconductor light emitting devices 10A. Each of the lenses 331 is disposed, for example, at a position overlapping with the light emitting element 11 and the mirror 13 in a plan view. The lens 331 includes, for example, a convex lens. The lens 331 may include a plano-convex lens, a biconvex lens, a meniscus lens, and the like. The light transmitted by the cover 15 of each of the semiconductor light emitting devices 10A is collimated by passing through the lens 331. The array lens 33 may have configurations that are different between the lower surface (e.g., the surface opposed to the base plate 31) side and the upper surface side. For example, one of the surface sides of the array lens 33 may have a FAC (Fast Axis Collimator) function and the other surface side may have a SAC (Slow Axis Collimator) function. The array lens 33 then has, for example, lenticular lenses disposed in the direction in which the lenticular lenses are orthogonal to each other. The array lens 33 includes, for example, one lens having a biconvex shape or two plano-convex lenses integrally bonded together on the flat surfaces. Alternatively, the array lens 33 includes two plano-convex lenses that have the flat surface sides aligned to point to the semiconductor light emitting device 10A side and are held and integrated by the frame section 33F of the array lens 33.

The frame section 33F around the array section 33A has, for example, a quadrangular planar shape. This frame section 33F is fixed to the holding section 321 of the lens holding member 32, for example, with adhesive or the like (not illustrated). It is possible to use a photocurable resin such as a UV (Ultra Violet) curable resin or the like as this adhesive. The shrinkage of the resin by photocuring facilitates the array lens 33 and the lens holding member 32 to have a positional deviation in between. It is thus preferable to use, for example, a resin material having a curing shrinkage amount of about several % or less. It is more preferable to use a resin material having a curing shrinkage amount of 1% or less. The array lens 33 may be fixed to the lens holding member 32, for example, by a screw or the like. Alternatively, the array lens 33 and the lens holding member 32 may be collectively molded by an insert molding process or the like. As described above, the spaces that are large enough to allow gas to flow are provided between the array section 33A and the base plate 31 and between the array section 33A and the semiconductor light emitting device 10A. The array lens 33 includes, for example, borosilicate glass or the like.

FIG. 7 illustrates the semiconductor light emitting device 10A illustrated in FIG. 1 along with the terminal section 322E of the lens holding member 32. The electrode extraction section 14E1 and the electrode extraction section 14E2 provided on the upper surface of each of the plurality of semiconductor light emitting devices 10A are coupled to each other, for example, through a wire (wiring line WA). The electrode extraction section 14E2 of the semiconductor light emitting device 10A disposed at the position that is the closest to the terminal section 322E of the lens holding member 32 is coupled to the terminal section 322E through the wiring line WA. This makes it possible to couple the outside and the light emitting element 11 of the semiconductor light emitting device 10A. It is to be noted that FIG. 7 omits the cover 15.

In addition, the metal patterns 141M2 provided on the back surfaces (the back surfaces 14S2 of the housing members 14) of the adjacent semiconductor light emitting devices 10A may be continuous, for example, with silver paste interposed in between. This thermally couples the metal patterns 141M2 of the adjacent semiconductor light emitting devices 10A and widens the heat dissipating path.

In the light emitting apparatus 1, light is extracted, for example, as follows. The light extracted from each of the semiconductor light emitting devices 10A placed on the base plate 31 passes, for example, through the lens 331 at the position corresponding to the semiconductor light emitting device 10A to be collimated light. The pieces of light passing through the respective lenses 331 thus travel in parallel to each other and are extracted from the light emitting apparatus 1.

(1-3. Workings and Effects)

In the semiconductor light emitting device 10A, the bonding member 16 (e.g., metal pattern 14MC) that bonds the housing member 14 and the cover 15 is used as an electrical conduction path that electrically couples an electrode of the light emitting element 11 and the electrode extraction section 14E. This increases the cross-sectional area of a wiring line that electrically couples the light emitting element 11 and the outside, making it possible to reduce the internal resistance. The following describes these workings and effects.

Driving a light emitting element including a semiconductor laser element causes the siloxane in the atmosphere to react with light near a light emitting point and a reactant tends to be deposited on an end surface of the light emitting element. This reactant causes a change in the reflectance of the end surface. This may cause a decrease in the optical characteristics and destroy the light emitting element. Especially a blue semiconductor laser element that emits, for example, a short wavelength of 500 nm or less tends to have a defect caused by this siloxane in the atmosphere. Hermetically sealing the semiconductor laser element or the like therefore makes it possible to suppress the occurrence of this defect caused by the siloxane in the atmosphere.

Incidentally, a member included in the main body of an SMD package that is used to hermetically seal a semiconductor laser element includes glass or ceramic. A metalized pattern for electrically coupling the anode and the cathode of the semiconductor laser element and an external electrode is formed on the main body of the package. It is, however, difficult because of the restriction of the manufacturing method to embed and fire a lead terminal or form a metalized pattern having, for example, a thickness of 1 mm or less or about several hundreds of μm. This increases the electrical resistance (internal resistance) and increases Joule heating and loss, causing a decrease in the power efficiency and a decrease in the performance of the semiconductor laser element.

In contrast, in the present embodiment, in the semiconductor light emitting device 10A, the wiring structure provided in the housing member 14 and the metal pattern 14MC provided on the bonded surface 14S1 of the housing member 14 are electrically coupled and used as an electrical conduction path that electrically couples an electrode of the light emitting element 11 and the electrode extraction section 14E.

For example, in the semiconductor light emitting device 10A, the metal pattern 144M1 is provided on the bonded surface 14S1 (specifically, the upper surface 144S1 of the bonding layer 144) of the housing member 14. The metal pattern 144M1 includes the metal pattern 14MC and the metal pattern 14ME. The metal pattern 14MC is used to bond the cover 15. The metal pattern 14ME is included in the electrode extraction section 14E1. Further, this metal pattern 144M1 and the wiring structure (e.g., metal pattern 143M1) in the housing member 14 are electrically coupled through the via V2. This allows the metal pattern 14MC to be used as a conduction path between the light emitting element 11 and the outside. The metal pattern 14MC is used to bond the cover 15. Specifically, for example, the cathode of the light emitting element 11 and an external electrode (e.g., electrode extraction section 14E1) have two conduction paths in between: a conduction path between the metal pattern 143M1 and the metal pattern 14ME included in the electrode extraction section 14E1 through the via V2; and a conduction path between the metal pattern 143M1 and the metal pattern 14MC through the two vias V2. This reduces the electrical resistance on the cathode side.

As described above, in the present embodiment, the bonding member 16 that bonds the housing member 14 and the cover 15 and the wiring structure formed in the housing member 14 are electrically coupled to be used as an electrical conduction path. This increases the cross-sectional area of a wiring line that electrically couples the light emitting element 11 and the outside. This allows the internal resistance to be reduced.

In addition, in the present embodiment, the electrode extraction section 14E is provided on the bonded surface 14S1 of the housing member 14. This makes it possible to thermally couple the metal patterns 141M2 of the adjacent semiconductor light emitting devices 10A, for example, by making the metal patterns 141M2 provided on the back surfaces (the back surfaces 14S2 of the housing members 14) of the adjacent semiconductor light emitting devices 10A continuous, for example, with silver paste interposed in between. This widens the heat dissipating path on the back surface of the semiconductor light emitting device 10A and makes it possible to increase the heat dissipation characteristics.

The following describes second to tenth embodiments, modification examples, and an application example. The following description, however, denotes the same components as those of the first embodiment described above by the same sings and descriptions thereof are omitted as appropriate.

2. Second Embodiment

FIG. 8 schematically illustrates an example of a planar configuration of a semiconductor light emitting device (semiconductor light emitting device 10B) according to a second embodiment of the present disclosure. FIG. 9 is an exploded perspective view of an example of a configuration of the housing member 14 illustrated in FIG. 8. The semiconductor light emitting device 10B according to the present embodiment is different from that of the first embodiment described above in that the metal pattern 14MC provided on the bonded surface 14S1 of the housing member 14 and the metal pattern 14ME are separately formed.

It is to be noted that the metal pattern 143M1 on the intermediate layer 143 is formed to surround the opening 143H in the present embodiment. This electrically couples the metal pattern 143M1 and a metal pattern 141M1A included in the metal pattern 14MC through the four vias V2. The metal pattern 143M1 and the metal pattern 14ME are electrically coupled through the one via V2. This electrically couples the metal pattern 14MC and the metal pattern 14ME through the via V2 and the metal pattern 143M1.

In this way, the metal pattern 14MC and the metal pattern 14ME are independently formed. This attains an effect of making it possible to prevent the solder pattern 151M provided on the cover 15 from flowing to the electrode extraction section 14E1 in addition to the effects in the first embodiment described above.

3. Third Embodiment

FIG. 10 schematically illustrates an example of a planar configuration of a semiconductor light emitting device (semiconductor light emitting device 10C) according to a third embodiment of the present disclosure. FIG. 11 is an exploded perspective view of an example of a configuration of the housing member 14 illustrated in FIG. 10. The semiconductor light emitting device 10C according to the present embodiment is different from that of the first embodiment described above in that a solder stop band 17 is formed on the border between the metal pattern 14MC that is used as the bonding member 16 of the metal pattern 144M1 provided on the bonded surface 14S1 of the housing member 14 and the metal pattern 14ME that is used as the electrode extraction section 14E1. The solder stop band 17 is, for example, a film of a dielectric material that coats the surface of the metal pattern 144M1. Examples of the dielectric material includes aluminum nitride (AlN), aluminum oxide ($Al_2O_3$), silicon oxide ($SiO_2$), silicon nitride (SiN), and the like.

In this way, the solder stop band 17 is provided on the border between the metal pattern 14MC and the metal pattern 14ME. This attains an effect of making it possible to prevent the solder pattern 151M provided on the cover 15 from flowing to the electrode extraction section 14E1 in addition to the effects in the first embodiment described above.

4. Fourth Embodiment

FIG. 12A schematically illustrates an example of a planar configuration of a semiconductor light emitting device (semiconductor light emitting device 10D) according to a fourth embodiment of the present disclosure. FIG. 12B is a plane schematic diagram of the cover 15 illustrated in FIG. 12A as viewed from the upper surface 15S1 side. FIG. 12C schematically illustrates a cross-sectional configuration taken along an IV-IV line illustrated in FIG. 12A. The semiconductor light emitting device 10D according to the present embodiment is different from that of the first embodiment described above in that the electrode extraction sections 14E1 and 14E2 provided on the surface of the housing member 14 in the first embodiment described above are provided on the upper surface 15S1 of the cover 15.

The upper surface 15S1 of the cover 15 is provided with a metal pattern 151M2 included in an electrode extraction section 15E. The respective metal patterns 151M2 are independently provided at three of the four corners of the cover 15 having, for example, a rectangular planar shape. These three metal patterns 151M2 each have, for example, a rectangular shape. Two of the three metal patterns 151M2 are, for example, electrode extraction sections 15E1 for cathodes. One of the three metal patterns 151M2 is, for example, an electrode extraction section 15E2 for an anode.

The lower surface 15S2 of the cover 15 is provided with a solder pattern 151M1A and a solder pattern 151M1B. The solder pattern 151M1A has substantially the same planar shape as that of the bonding metal pattern 14MC portion formed on the bonded surface 14S1 of the housing member 14. The solder pattern 151M1B is provided inside the solder pattern 151M1A and has, for example, a circular shape. The solder pattern 151M1B is provided at the position corresponding, for example, to the electrode extraction section 15E2 for an anode. The electrode extraction section 15E2 for an anode is provided on the upper surface 15S1 of the cover 15.

The cover 15 is further provided with two vias V4 and one via V5 that penetrate the cover 15 in the Z axis direction. The two vias V4 couple, for example, the electrode extraction section 15E1 for a cathode and the solder pattern 151M1A. The one vias V5 couples, for example, the electrode extraction section 15E2 for an anode and the solder pattern 151M1B.

FIG. 13 is an exploded perspective view of an example of a configuration of the housing member 14 illustrated in FIG. 12A. In the present embodiment, the metal pattern 144M2 is provided inside the metal pattern 144M1 that surrounds the opening 144H along the edge. The metal patterns 141M1, 143M1, and 143M2 and the vias V1, V2, and V3 provided to the first layer 141 and the intermediate layer 143 are each patterned to correspond to the metal pattern 144M1 and the metal pattern 144M2.

This draws out, for example, the cathode of the light emitting element 11 from the electrode extraction section 15E1, for example, through the metal pattern 141M1, the via V1, the metal pattern 143M1, the two vias V2, the metal pattern 144M1, the solder pattern 151M1A, and the via V4. For example, the anode of the light emitting element 11 is drawn out from the electrode extraction section 15E2, for example, through the wire W, the metal pattern 143M2, the via V3, the metal pattern 144M2, the solder pattern 151M1B, and the via V5. In addition, in a case where an insulating material is used for the submount 12, a wire is coupled from a metal pattern (not illustrated) on the submount 12 to the metal pattern 143M1 or the metal pattern 141M1. This electrically couples, for example the electrode extraction section 15E1 and the light emitting element 11.

In this way, providing the electrode extraction section 15E on the upper surface 15S1 of the cover 15 shortens the conduction path between the light emitting element 11 and the electrode extraction section 15E as compared with the first embodiment described above, making it possible to further reduce the internal resistance.

In addition, in the present embodiment, the two electrode extraction sections 15E1 and one electrode extraction section E2 are disposed in the shape of a letter L. This makes it possible to form a horizontal or longitudinal array, for example, in a case where the plurality of semiconductor light emitting devices 10D is coupled in series in the light emitting apparatus 1. This increases the degree of layout freedom.

Further, in the present embodiment, the upper surface 15S1 of the cover 15 is provided with the electrode extraction section 15E. This allows for miniaturization as compared with the first embodiment described above. For example, it is thus possible to suppress the cost of the light emitting apparatus 1. In addition, it is possible to place the semiconductor light emitting devices 10D more closely in the light emitting apparatus 1. Further, as the semiconductor light emitting device 10D is decreased in size, the housing member 14 and the cover 15 have a smaller bonding region. This makes it possible to suppress the occurrence of a short circuit and a crack in the housing member 14 or the like due to stress concentrating on the bonding region.

5. Fifth Embodiment

FIG. 14A schematically illustrates an example of a planar configuration of a semiconductor light emitting device (semiconductor light emitting device 10E) according to a fifth embodiment of the present disclosure. FIG. 14B schematically illustrates a cross-sectional configuration of the cover 15 taken along a V-V line illustrated in FIG. 14A. FIG. 15 is an exploded perspective view of an example of a configuration of the housing member 14 illustrated in FIG. 14A. FIG. 16 schematically illustrates an example of the planar shape of a metal pattern 142M1 provided on an upper surface 142S1 of the second layer 142 illustrated in FIG. 15. The semiconductor light emitting device 10E according to the present embodiment is different from that of the first embodiment described above in that there is provided a recessed section 15C on the lower surface 15S2 side of the cover 15 and the housing member 14 includes the first layer 141 and the second layer 142. The recessed section 15C houses the light emitting element 11 and the like.

In the present embodiment, the upper surface 141S1 of the first layer 141 is provided with the two metal patterns 141M1A and 141M1B that are independent from each other. The second layer 142 is provided with an opening 142H in which the mirror 13 is disposed. The upper surface 142S1 of the second layer 142 is provided with the metal pattern 142M1 having, for example, the planar shape illustrated in FIG. 16. The metal pattern 142M1 includes a metal pattern 14MM on which the submount 12 is mounted in addition to the metal pattern 14MC that is used for bonding and the metal pattern 14ME included in the electrode extraction section 14E1. The metal pattern 14MM is provided inside the metal pattern 14MC along the edge. There are provided openings 14MH1 and 14MH2 on both of the respective sides of the metal pattern 14MM. The opening 14MH1 is provided, for example, to include the opening 142H. The upper surface 142S1 of the second layer 142 is provided with a metal pattern 142M2A next to the metal pattern 14ME and a metal pattern 142M2B inside the opening 14MH2 as a metal pattern 142M2. Solder stop bands 17A, 17B, and 17C are each formed on the border between the metal pattern 14MC and the metal pattern 14ME and the border between the metal pattern 14MC and the metal pattern 14MM. The second layer 142 is further provided with one via V6 and two vias V7 that penetrate the second layer 142 in the Z axis direction. The one via V6 couples the metal pattern 141M1A and the metal pattern 14MC of the metal pattern 142M1. The two respective vias V7 couple the metal pattern 141M1B and the metal pattern 142M2A and the metal pattern 142M2B.

In this way, providing the recessed section 15C on the cover 15 side makes it possible to achieve a decrease in thickness in addition to the effects of the first embodiment described above.

6. Sixth Embodiment

FIG. 17 schematically illustrates an example of a planar configuration of a semiconductor light emitting device (semiconductor light emitting device 10F) according to a sixth embodiment of the present disclosure. FIG. 18 is an exploded perspective view of an example of a configuration of the housing member 14 illustrated in FIG. 17. FIG. 19 schematically illustrates an example of the planar shape of the metal pattern 142M1 illustrated in FIG. 18. The semiconductor light emitting device 10F according to the present embodiment is different from that of the fifth embodiment described above in that the submount 12 on which the light emitting element 11 is mounted and the mirror 13 are mounted in the same plane (the upper surface 142S1 of the second layer 142).

In the present embodiment, the upper surface 141S1 of the first layer 141 is provided with the metal pattern 141M1B. The upper surface 142S1 of the second layer 142 is provided with the metal pattern 142M1 having, for example, the planar shape illustrated in FIG. 19. The metal pattern 142M1 includes a metal pattern 14MM1 on which the submount 12 is mounted and a metal pattern 14MM2 on which the mirror 13 is mounted in addition to the metal pattern 14MC that is used for bonding and the metal pattern 14ME included in the electrode extraction section 14E1. The metal pattern 14MM1 and the metal pattern 14MM2 are provided inside the metal pattern 14MC along the edge. There is provided an opening 14MH3 between the metal pattern 14MM1 and the metal pattern 14MM2. In addition, the opening 14MH2 is provided inside the metal pattern 14MC along the edge as in the fifth embodiment described above. The upper surface 142S1 of the second layer 142 is provided with the metal pattern 142M2A next to the metal pattern 14ME and the metal pattern 142M2B inside the opening 14MH2 as the metal pattern 142M2.

The solder stop bands 17A, 17B, and 17C are each formed on the border between the metal pattern 14MC and the metal pattern 14ME and the borders between the metal pattern 14MC and the metal pattern 14MM1 and the metal pattern 14MM2. The metal pattern 141M1B is coupled to the respective metal patterns 142M2A and 142M2B through the two vias V7.

In this way, the bottom surface of the recessed section 14C may be a flat surface and the mirror 13 and the submount 12 on which the light emitting element 11 is mounted may be disposed in the same plane. Mounting the submount 12 and the mirror 13 on the same metal pattern (metal pattern 142M1) makes it possible to prevent a stacking deviation in metal patterns serving as the respective mounting surfaces as compared with the first embodiment, the fifth embodiment, and the like described above. This makes it possible to increase the mounting accuracy in addition the effects of the first embodiment and the fifth embodiment described above.

7. Seventh Embodiment

FIG. 20 schematically illustrates an example of a planar configuration of a semiconductor light emitting device (semiconductor light emitting device 10G) according to a seventh embodiment of the present disclosure. The semiconductor light emitting device 10G according to the present embodiment is different from that of the second embodiment described above in that the metal pattern 14MC provided on the bonded surface 14S1 of the housing member 14 and the metal pattern 14ME are separately formed and the metal pattern 14MC and the metal pattern 14ME are electrically coupled by the solder pattern 151M.

In this way, the metal pattern 14MC and the metal pattern 14ME may be coupled by using the bonding member 16 (solder pattern 151M) provided on the cover 15 side.

8. Eighth Embodiment

FIG. 21 schematically illustrates an example of a planar configuration of a semiconductor light emitting device (semiconductor light emitting device 10H) according to an eighth embodiment of the present disclosure. FIG. 22 is an exploded perspective view of an example of a configuration of the housing member 14 illustrated in FIG. 21. The semiconductor light emitting device 10H according to the present embodiment is different from that of the first embodiment described above in that the metal pattern 14MC provided on the bonded surface 14S1 of the housing member 14 and the metal pattern included in the electrode extraction section 14E1 and the electrode extraction section 14E2 are separated formed on the bonded surface 14S1 of the housing member 14 and a metal pattern 144M3 included in the metal pattern 14MC is used as a ground (GND) pattern.

In the present embodiment, the entire upper surface 141S1 of the first layer 141 is provided with the metal pattern 141M1. The upper surface 143S1 of the intermediate layer 143 is provided with the metal patterns 143M1 and 143M2 similar to those of the first embodiment described above. In addition, the intermediate layer 143 is provided with two through holes 143Hv in which vias V8 are formed. The vias V8 electrically couple the metal pattern 141M1 provided on the first layer 141 and the metal pattern 144M3 provided on the upper surface 144S1 of the bonding layer 144. The upper surface 144S1 of the bonding layer 144 is independently provided with the metal patterns 144M1 and 144M2 included in the electrode extraction sections 14E1 and 14E2 and the metal pattern 144M3 that is used as the GND pattern. The metal pattern 144M3 is provided to surround the opening 144H along the edge. The opening 144H is provided in the bonding layer 144. The metal pattern 144M3 is included in the metal pattern 14MC for bonding the cover 15 (specifically, the solder pattern 151M). In addition, a portion of the metal pattern 144M3 is drawn out between the metal pattern 144M1 and the metal pattern 144M2. The portion of the metal pattern 144M3 is coupled, for example, to an external electrode (GND electrode) (metal pattern 14MG). The solder stop band 17 is formed on the border between the metal pattern 14MC and the metal pattern 14MG. The metal pattern 143M1 and the metal pattern 144M1 are electrically coupled through the via V2 and the metal pattern 143M2 and the metal pattern 144M2 are electrically coupled through the via V3. The metal pattern 144M3 is electrically coupled to the metal pattern 141M1 by the via V8 that penetrates the intermediate layer 143 and the bonding layer 144 as described above.

In this way, the recessed section 14C that houses the light emitting element 11 may be surrounded and the metal pattern 14MC that is used to bond the cover 15 may be used as the GND pattern. This attains an effect of making it possible to reduce EMI, for example, in a case where the light emitting element 11 is driven at the high frequency in addition to the effects of the first embodiment described above. In addition, it is also possible to place a high-frequency device that is sensitive to noise.

9. Ninth Embodiment

FIG. 23 schematically illustrates an example of a planar configuration of a semiconductor light emitting device (semiconductor light emitting device 10I) according to a ninth embodiment of the present disclosure. FIG. 24 is an exploded perspective view of an example of a configuration of the housing member 14 illustrated in FIG. 23. FIGS. 25A to 25C schematically illustrate cross-sectional configurations of the housing member 14 taken along a VI-VI line, a VII-VII line, and a VIII-VIII line illustrated in FIG. 23. The semiconductor light emitting device 10I according to the present embodiment is different from that of the first embodiment described above in that the light of the light emitting element 11 is extracted in the horizontal direction.

The housing member 14 according to the present embodiment is provided with a cover 18 on the side surface with a bonding member 19 interposed in between. The cover 18 has light transmissivity. The light emitted from the light emitting element 11 placed in the recessed section 14C of the housing member 14 is extracted through this cover 18. The cover 15 that is bonded to the bonded surface 14S1 of the housing member 14 does not therefore necessarily have to have light transmissivity. For example, it is possible to use a metal plate. This allows the main body of the cover 15 to be used as an electrical conduction path.

In addition, in the present embodiment, the second layer 142 has a three-layer structure in which two intermediate layers (the intermediate layer 143 and an intermediate layer 145) and the bonding layer 144 are stacked in this order. The intermediate layer 143 is provided with a cutout 143X having the shape of a letter U as the planar shape. The upper surface 143S1 is provided, for example, with the metal patterns 143M1 and 143M2 similar to those of the first embodiment described above. The intermediate layer 143 is further provided with the via V1 that penetrates the intermediate layer 143 in the Z axis direction. The metal pattern 143M1 and the metal pattern 141M1 of the first layer 141 are electrically coupled. The intermediate layer 145 is provided with a cutout 145X having the shape of a letter U as the planar shape as with the intermediate layer 143. The cutout 145X of the intermediate layer 145 is deeper than the cutout 143X of the intermediate layer 143. For example, the side surface of the cutout 145X forms the same side surface as that of a portion of the opening 144H provided in the bonding layer 144. In the present embodiment, the submount 12 is mounted on the metal pattern 143M1 in this cutout 145X. In addition, the intermediate layer 145 is provided with through holes 145H1, 145H2, and 145H3 through which the two vias V2 and the one via V3 pass. The two vias V2 couple the metal pattern 143M1 and the metal pattern 144M1. The one via V3 couples the metal pattern 143M2 and the metal pattern 144M2. The upper surface 144S1 of the bonding layer 144 is provided, for example, with the metal patterns 144M1 and 144M2 similar to those of the first embodiment described above. The solder stop band 17 is formed on the border between the metal pattern 14MC of the metal pattern 144M1 and the metal pattern 14ME.

In this way, the light emitted from the light emitting element 11 is extracted from the horizontal direction, thereby allowing a metal plate to be used as the cover 15. This makes it possible to further increase the cross-sectional area of a wiring line that electrically couples the light emitting element 11 and the outside (e.g., electrode extraction section 14E1) and makes it possible to further reduce the internal resistance.

In addition, the semiconductor light emitting device 10I may have a configuration as follows. FIG. 26 schematically illustrates another example of a planar configuration of the semiconductor light emitting device 10I. FIG. 27 schematically illustrates a cross-sectional configuration of the semiconductor light emitting device 10I taken along an IX-IX line illustrated in FIG. 26. For example, a lens 23 may be disposed at a cutout section 143X of the intermediate layer 143. This lens 23 is, for example, a collimating lens. In a case where the light emitted from the light emitting element 11 is extracted from the horizontal direction as in the semiconductor light emitting device 10I according to the present embodiment, a great angle of radiation may cause vignetting to occur. Mounting the lens 23 therefore decreases the angle of radiation and makes it possible to prevent vignetting from occurring.

10. Tenth Embodiment

FIG. 28 schematically illustrates an example of a planar configuration of a semiconductor light emitting device (semiconductor light emitting device 10J) according to a tenth embodiment of the present disclosure. FIG. 29 schematically illustrates a cross-sectional configuration of the semiconductor light emitting device 10J taken along an X-X line illustrated in FIG. 28. FIG. 30 is an exploded perspective view of a configuration of the housing member 14 illustrated in FIG. 28. The semiconductor light emitting device 10J according to the present embodiment is different from that of the first embodiment described above in that a vertical resonator surface emitting laser is used as a light emitting element 21.

In the present embodiment, the upper surface 141S1 of the first layer 141 is provided with the two metal patterns 141M1A and 141M1B that are independent from each other. The second layer 142 has the opening 142H. The upper surface 142S1 is provided, for example, with the metal patterns 142M1 and 142M2 similar to the metal patterns 144M1 and 144M2 in the first embodiment described above. The metal pattern 142M1 includes the bonding metal pattern 14MC and the metal pattern 14ME included in the electrode extraction section 14E1. The solder stop band 17 is formed on the border between the metal pattern 14MC and the metal pattern 14ME. The metal pattern 141M1A and the metal pattern 142M1 are electrically coupled through the via V1 and the metal pattern 141M1B and the metal pattern 142M2 are electrically coupled through the via V2. The light emitting element 21 is mounted in the opening 142H through the submount 12.

In addition, the semiconductor light emitting device 10J may be provided with a lens 153 on the upper surface 15S1 side of the cover 15 as illustrated in FIG. 31. This makes it possible to control the angle of radiation of the light emitted from the light emitting element 21. It is to be noted that the lens 153 may also be provided on the lower surface 15S2 side of the cover 15. Alternatively, the lenses 153 may be provided on both the upper surface 15S1 side and the lower surface 15S2 side of the cover 15. However, as illustrated in FIG. 31, providing the lens 153 on the upper surface 15S1 side of the cover 15 allows for miniaturization as compared with the lens 153 provided on the lower surface 15S2 side of the cover 15.

Further, the semiconductor light emitting device 10J may be provided with a diffraction element 154 on the upper surface 15S1 side of the cover 15 as illustrated in FIG. 32. Providing the diffraction element 154 makes it possible to convert the light emitted from the light emitting element 21 into a desired output such as a random dot pattern.

11. Modification Examples

Modification Example 1

FIG. 33 is a schematic exploded perspective view of a main portion of a light emitting apparatus (light emitting apparatus 2) according to a modification example 1 of the present disclosure. This light emitting apparatus 2 includes the base plate 31, the semiconductor light emitting device (e.g., semiconductor light emitting device 10A), and the array lens 33 in this order. In other words, the light emitting apparatus 2 is not provided with the lens holding member (e.g., lens holding member 32 in FIG. 5). The base plate 31 of the light emitting apparatus 2 includes, for example, a plate section 311, a holding section 312, and a terminal section 313E. Except for this point, the light emitting apparatus 2 according to the present modification example has a configuration similar to that of the light emitting apparatus 1 according to the first embodiment described above. The light emitting apparatus 2 according to the present modification example also has similar workings and effects.

The plate section 311 of the base plate 31 is, for example, a plate member having a quadrangular planar shape. The plurality of semiconductor light emitting devices 10A is placed on this plate section 311, for example, in a matrix.

The holding section 312 has the planar shape of a quadrangular frame that surrounds the plurality of semiconductor light emitting devices 10A disposed in the middle portion of the plate section 311. The holding section 312 is in contact with the plate section 311 and the array lens 33 (frame section 33F). The distance between each of the semiconductor light emitting devices 10A and the lens 331 is adjusted in accordance with the thickness of the holding section 312.

The terminal section 313E has, for example, the planar shape of a band that extends in one direction (Y direction in FIG. 33). The terminal section 313E is provided on the plate section 311. This terminal section 313E extends from the inside to the outside of the holding section 312. The electrode extraction sections 14E1 and 14E2 of the semiconductor light emitting device 10A are electrically coupled to this terminal section 313E. This electrically couples the light emitting element 11 to the outside.

The plate section 311, the holding section 312, and the terminal section 313E are, for example, integrated. The plate section 311 includes, for example, aluminum. The holding section 312 includes, for example, PEEK (polyether ether ketone). The terminal section 313E includes a metal material. The plate section 311 and the holding section 312 are collectively molded, for example, by insert-injection molding or the like. The plate section 311 may include, for example, aluminum (Al), copper (Cu), copper tungsten (Cu—W), aluminum nitride (AlN), or the like. The holding section 312 may include, for example, alumina, aluminum nitride, Kovar, or the like. In this case, the plate section 311 and the holding section 312 are insulated from the terminal section 313E, for example, by low-melting glass or the like.

Modification Example 2

The plurality of respective semiconductor light emitting devices 10A (light emitting elements 11) placed on the base plate 31 may emit pieces of light in a plurality of wavelength ranges. The plurality of semiconductor light emitting devices 10A placed on the base plate 31 may include, for example, the semiconductor light emitting device 10A including the light emitting element 11 that emits light in the red wavelength range, the semiconductor light emitting device 10A including the light emitting element 11 that emits light in the blue wavelength range, and the semiconductor light emitting device 10A including the light emitting element 11 that emits light in the green wavelength range. The ratio and disposition of the semiconductor light emitting devices 10A of the respective colors are adjusted on the basis of a luminosity curve and an output (mW and lm). This makes it possible to extract white light from the light emitting apparatus 1. In this case, for example, the light emitting apparatus 1 includes a diffuser panel or the like. The light emitted from the semiconductor light emitting device 10A passes through the lens 331 and the diffuser panel or the like.

In this way, it is possible to easily place, on the base plate 31, the semiconductor light emitting devices 10A (light emitting elements 11) that emit pieces of light in wavelength ranges different from each other at a desired ratio and in desired disposition. Therefore, it is possible to easily adjust the entire optical balance.

The light emitting element 11 may also include LED (Light Emitting Diode) or the like. However, in the light emitting element 11 including a semiconductor laser element, it is possible to further increase the light intensity and recognize light at a more distant position as compared with the light emitting element 11 including LED.

12. Application Example

The light emitting apparatuses 1 and 2 described in the first embodiment and the modification examples described above are applicable, for example, to a projection display.

FIG. 34 is a diagram illustrating a configuration example of a projection display (projection display 200) to which the light emitting apparatuses 1 and 2 are applied as light sources. This projection display 200 is, for example, a display that projects an image on a screen. The projection display 200 is coupled to an external image supplying apparatus such as a computer including PC or the like or a variety of image players through I/F (interface). The projection display 200 makes a projection on the screen or the like on the basis of an image signal that is inputted to this I/F. It is to be noted that a configuration of the projection display 200 described below is an example. The projection display according to the present technology is not limited to such a configuration.

The projection display 200 includes the light emitting apparatuses 1 and 2, a multi-lens array 212, a PBS array 213, a focus lens 214, mirrors 215a and 215c to 215e, dichroic mirrors 216 and 217, light modulators 218a to 218c, a dichroic prism 219, and a projection lens 220.

In each of the light emitting apparatuses 1 and 2, the light emitted from the light emitting element 11 passes through the array lens 33 and is extracted as collimated light. This light enters the multi-lens array 212. The multi-lens array 212 has a structure in which a plurality of lens elements is provided in an array. The multi-lens array 212 condenses the light emitted from each of the light emitting apparatuses 1 and 2. The PBS array 213 polarizes the light condensed by the multi-lens array 212 as light having a predetermined polarization direction, for example, a P-polarized wave. The focus lens 214 condenses the light that has been converted by the PBS array 213 into the light having a predetermined polarization direction.

The dichroic mirror 216 transmits red light R and reflects green light G and blue light B of the pieces of light that have entered the dichroic mirror 216 through the focus lens 214 and the mirror 215e. The red light R transmitted by the dichroic mirror 216 is guided to the light modulator 218a through the mirror 215a.

The dichroic mirror 217 transmits the blue light B and reflects the green light G of the pieces of light reflected by the dichroic mirror 216. The green light G reflected by the dichroic mirror 217 is guided to the light modulator 218b. In contrast, the blue light B transmitted by the dichroic mirror 217 is guided to the light modulator 218c through the mirror 215d and the mirror 215c.

The light modulators 218a to 218c optically modulate the respective pieces of incident color light and input the respective pieces of optically modulated color light to the dichroic prism 219. The dichroic prism 219 combines the respective pieces of color light that have been optically modulated and entered the dichroic prism 219 into one optical axis. The respective pieces of combined color light are projected onto a screen or the like through the projection lens 220.

In the projection display 200, the three light modulators 218a to 218c corresponding to the three primary colors of red, green, and blue are combined and display any color. In other words, the projection display 200 is a so-called three-plate projection display.

The present technology has been described with reference to the first to tenth embodiments, the modification examples, and the application example, but the present technology is not limited to the embodiments or the like described above. A variety of modifications are possible. For example, the components, the disposition, the number, and the like of the light emitting apparatuses 1 and 2 exemplified in the embodiments or the like described above are merely examples. Each of the light emitting apparatuses 1 and 2 does not have to include all the components. In addition, each of the light emitting apparatuses 1 and 2 may further include another component.

In addition, in the first embodiment or the like described above, the example has been described in which the bonding member 16 is used as an electrical conduction path between the cathode of the light emitting element 11 and the electrode extraction section 14E1, but this is not limitative. For example, the bonding member 16 may also be used as an electrical conduction path between the anode of the light emitting element 11 and the electrode extraction section 14E2. In addition, in the first embodiment or the like described above, the example has been described in which the one light emitting element 11 is housed in the recessed section 14C, but the two or more light emitting elements 11 may be housed. Moreover, the light emitting elements 11 corresponding to wavelengths different from each other may be housed.

Further, the above-described light emitting apparatuses 1 and 2 provided with the terminal sections 322E and 313E in the lens holding member 32 or the base plate 31 have been described. Each of the terminal sections 322E and 313E is for electrically coupling the light emitting element 11 and the outside. There may be, however, provided terminal sections separately from the lens holding member 32 or the base plate 31.

It is to be noted that the effects described in this specification are mere examples, but not limited thereto. In addition, there may be other effects.

It is to be noted that the technology may have a configuration as follows. According to the present technology having the following configurations, the electrically conductive bonding section is electrically coupled to the wiring structure provided in the first housing member. This increases the cross-sectional area of a wiring line that electrically couples the light emitting element and the outside. The electrically conductive bonding section bonds the first housing member and the second housing member. The light emitting element is housed in the first housing member and the second housing member. This allows the internal resistance to be reduced.

(1)
  A semiconductor light emitting device including:
  a light emitting element;
  a first housing member and a second housing member at least one of which has a wiring structure, the first housing member and the second housing member housing the light emitting element, the wiring structure electrically coupling the light emitting element and an outside; and
  an electrically conductive bonding section that bonds the first housing member and the second housing member, the electrically conductive bonding section being electrically coupled to the wiring structure.

(2)
  The semiconductor light emitting device according to (1), in which
  the first housing member includes a first recessed section, a first layer, and a second layer, the first recessed section forming a housing space in which the light emitting element is housed, the first layer being included in a bottom surface of the first recessed section, the second layer being included in a side surface of the first recessed section,
  one or more first metal patterns are formed on the first layer, and
  one or more second metal patterns are formed on the second layer, the one or more second metal patterns being electrically coupled to at least a portion of the one or more first metal patterns.

(3)
  The semiconductor light emitting device according to (2), in which the one or more first metal patterns and the one or more second metal patterns are electrically coupled through through vias, the through vias penetrating the second layer.

(4)
  The semiconductor light emitting device according to (2) or (3), in which
  the second layer includes a bonding layer and an intermediate layer, the bonding layer being bonded to the second housing member, the intermediate layer being disposed between the bonding layer and the first layer, and
  the one or more second metal patterns are formed on each of the bonding layer and the intermediate layer.

(5)
  The semiconductor light emitting device according to (4), in which at least a portion of the one or more second metal patterns formed on the bonding layer is included in the electrically conductive bonding section.

(6)
  The semiconductor light emitting device according to (4) or (5), in which the one or more second metal patterns formed on the bonding layer include an electrode extraction section, the electrode extraction section being electrically coupled to an electrode of the light emitting element.

(7)
  The semiconductor light emitting device according to (6), in which the electrically conductive bonding section and the electrode extraction section are electrically coupled.

(8)
  The semiconductor light emitting device according to any of (1) to (7), in which
  the first housing member and the second housing member are bonded with solder interposed in between, and
  the solder is included in the electrically conductive bonding section.

(9)
  The semiconductor light emitting device according to any of (1) to (8), in which the second housing member includes a second recessed section, the second recessed section forming a housing space in which the light emitting element is housed.

(10)

The semiconductor light emitting device according to any of (1) to (9), in which
the second housing member has light transmissivity, and light emitted from the light emitting element is outputted to the outside through the second housing member.

(11)

The semiconductor light emitting device according to (10), in which
the second housing member has a light emitting surface on an opposite side to a bonded surface to the first housing member, and
the light emitting surface has a lens shape.

(12)

The semiconductor light emitting device according to any of (2) to (11), in which
the first housing member has light transmissivity on at least a portion of a side surface included in the first recessed section, and
light emitted from the light emitting element is emitted to the outside through the side surface.

(13)

The semiconductor light emitting device according to any of (2) to (12), further including a reflecting member that reflects light emitted from the light emitting element, in which
the reflecting member is housed in the first recessed section along with the light emitting element.

(14)

The semiconductor light emitting device according to any of (1) to (13), further including a submount, in which
the submount is disposed between the light emitting element and the first housing member.

(15)

The semiconductor light emitting device according to (14), in which the submount has electrical conductivity.

(16)

The semiconductor light emitting device according to any of (1) to (15), in which the light emitting element includes a semiconductor laser.

(17)

The semiconductor light emitting device according to (16), in which the semiconductor laser includes a gallium nitride (GaN)-based semiconductor.

(18)

The semiconductor light emitting device according to any of (1) to (17), including the light emitting elements that emit pieces of light having wavelengths different from each other.

(19)

The semiconductor light emitting device according to any of (3) to (18), in which the reflecting member includes a mirror.

This application claims the priority on the basis of Japanese Patent Application No. 2019-018059 filed with Japan Patent Office on Feb. 4, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor light emitting device comprising:
a light emitting element;
a first housing member and a second housing member at least one of which has a wiring structure, the first housing member and the second housing member housing the light emitting element, the wiring structure electrically coupling the light emitting element and an outside; and
an electrically conductive bonding section that bonds the first housing member and the second housing member, the electrically conductive bonding section being electrically coupled to the wiring structure, wherein
the first housing member includes a first recessed section, a first layer, and a second layer, the first recessed section forming a housing space in which the light emitting element is housed, the first layer being included in a bottom surface of the first recessed section, the second layer being included in a side surface of the first recessed section,
one or more first metal patterns are formed on the first layer,
one or more second metal patterns are formed on the second layer, the one or more second metal patterns being electrically coupled to at least a portion of the one or more first metal patterns,
the second layer includes a bonding layer and an intermediate layer, the bonding layer being bonded to the second housing member, the intermediate layer being disposed between the bonding layer and the first layer,
the one or more second metal patterns are formed on each of the bonding layer and the intermediate layer, and
the one or more second metal patterns formed on the bonding layer include an electrode extraction section, the electrode extraction section being electrically coupled to an electrode of the light emitting element.

2. The semiconductor light emitting device according to claim 1, wherein the one or more first metal patterns and the one or more second metal patterns are electrically coupled through through vias, the through vias penetrating the second layer.

3. The semiconductor light emitting device according to claim 1, wherein at least a portion of the one or more second metal patterns formed on the bonding layer is included in the electrically conductive bonding section.

4. The semiconductor light emitting device according to claim 1, wherein the electrically conductive bonding section and the electrode extraction section are electrically coupled.

5. The semiconductor light emitting device according to claim 1, wherein
the first housing member and the second housing member are bonded with solder interposed in between, and
the solder is included in the electrically conductive bonding section.

6. The semiconductor light emitting device according to claim 1, wherein the second housing member includes a second recessed section, the second recessed section forming a housing space in which the light emitting element is housed.

7. The semiconductor light emitting device according to claim 1, wherein
the second housing member has light transmissivity, and
light emitted from the light emitting element is outputted to the outside through the second housing member.

8. The semiconductor light emitting device according to claim 7, wherein
the second housing member has a light emitting surface on an opposite side to a bonded surface to the first housing member, and
the light emitting surface has a lens shape.

9. The semiconductor light emitting device according to claim 1, wherein
the first housing member has light transmissivity on at least a portion of a side surface included in the first recessed section, and
light emitted from the light emitting element is emitted to the outside through the side surface.

10. The semiconductor light emitting device according to claim 1, further comprising a reflecting member that reflects light emitted from the light emitting element, wherein
the reflecting member is housed in the first recessed section along with the light emitting element.

11. The semiconductor light emitting device according to claim 1, further comprising a submount, wherein
the submount is disposed between the light emitting element and the first housing member.

12. The semiconductor light emitting device according to claim 11, wherein the submount has electrical conductivity.

13. The semiconductor light emitting device according to claim 1, wherein the light emitting element includes a semiconductor laser.

14. The semiconductor light emitting device according to claim 13, wherein the semiconductor laser includes a gallium nitride (GaN)-based semiconductor.

15. The semiconductor light emitting device according to claim 1, further comprising a plurality of light emitting elements which include the light emitting element, wherein the light emitting elements are configured to emit light having wavelengths different from each other.

16. The semiconductor light emitting device according to claim 10, wherein the reflecting member includes a mirror.

* * * * *